(12) United States Patent
Tang et al.

(10) Patent No.: US 9,564,442 B2
(45) Date of Patent: Feb. 7, 2017

(54) METHODS OF FORMING CONTACTS FOR A SEMICONDUCTOR DEVICE STRUCTURE, AND RELATED METHODS OF FORMING A SEMICONDUCTOR DEVICE STRUCTURE

(71) Applicant: Micron Technology, Inc., Boise, ID (US)

(72) Inventors: Sanh D. Tang, Kuna, ID (US); Wolfgang Mueller, Garden City, ID (US); Sourabh Dhir, Boise, ID (US); Dylan R. MacMaster, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/681,884

(22) Filed: Apr. 8, 2015

(65) Prior Publication Data

US 2016/0300842 A1 Oct. 13, 2016

(51) Int. Cl.

| | |
|---|---|
| *H01L 21/8238* | (2006.01) |
| *H01L 27/108* | (2006.01) |
| *H01L 21/768* | (2006.01) |
| *H01L 21/311* | (2006.01) |
| *H01L 21/762* | (2006.01) |
| *H01L 21/02* | (2006.01) |

(Continued)

(52) U.S. Cl.
CPC ... *H01L 27/10805* (2013.01); *H01L 21/02068* (2013.01); *H01L 21/31111* (2013.01); *H01L 21/762* (2013.01); *H01L 21/76834* (2013.01); *H01L 21/76877* (2013.01); *H01L 23/528* (2013.01); *H01L 27/1085* (2013.01); *H01L 27/10885* (2013.01); *H01L 27/10888* (2013.01); *H01L 27/10891* (2013.01); *H01L 29/0649* (2013.01)

(58) Field of Classification Search
CPC .................................................. H01L 27/10805
USPC .......................................................... 438/207
See application file for complete search history.

(56) References Cited

U.S. PATENT DOCUMENTS

| | | | | |
|---|---|---|---|---|
| 5,013,680 A | * | 5/1991 | Lowrey ................. | H01L 21/033 257/E21.033 |
| 5,401,681 A | * | 3/1995 | Dennison .............. | H01L 21/768 257/296 |

(Continued)

*Primary Examiner* — Ajay K Arora
(74) *Attorney, Agent, or Firm* — TraskBritt

(57) ABSTRACT

A method of forming contacts for a semiconductor device structure comprises forming contact holes extending into neighboring semiconductive pillars and into a nitride material of nitride-capped electrodes. Composite structures are formed within the contact holes and comprise oxide structures over sidewalls of the contact holes and nitride structures over the oxide structures. Conductive structures are formed over inner sidewalls of the composite structures. Additional nitride-capped electrodes are formed over the conductive structures and extend perpendicular to the nitride-capped electrodes. Pairs of nitride spacers are formed over opposing sidewalls of the additional nitride-capped electrodes and are separated from neighboring pairs of nitride spacers by apertures extending to upper surfaces of a portion of the neighboring semiconductive pillars. Portions of the oxide structures are removed to expose sidewalls of the portion of the neighboring semiconductive pillars. Semiconductor device structures and additional methods are also described.

18 Claims, 28 Drawing Sheets

(51) Int. Cl.
*H01L 29/06* (2006.01)
*H01L 23/528* (2006.01)

(56) References Cited

U.S. PATENT DOCUMENTS

| | | | |
|---|---|---|---|
| 5,700,716 | A | 12/1997 | Sharan et al. |
| 6,066,870 | A | 5/2000 | Siek |
| 6,426,528 | B2 | 7/2002 | Lowrey et al. |
| 6,686,288 | B1 | 2/2004 | Prall et al. |
| 6,696,336 | B2 | 2/2004 | DeBoer et al. |
| 6,709,945 | B2 | 3/2004 | McClure |
| 7,183,603 | B2 | 2/2007 | Park |
| 7,199,419 | B2 | 4/2007 | Haller |
| 7,241,655 | B2 | 7/2007 | Tang et al. |
| 7,345,333 | B2 | 3/2008 | DeBoer et al. |
| 7,501,676 | B2 | 3/2009 | Doyle |
| 7,670,932 | B2 | 3/2010 | Zhu et al. |
| 7,825,452 | B2 | 11/2010 | Eppich |
| 8,450,207 | B2 | 5/2013 | Surthi et al. |
| 8,716,772 | B2 | 5/2014 | Wang et al. |
| 8,729,675 | B1 | 5/2014 | Choi et al. |
| 2006/0125044 | A1* | 6/2006 | Haller ............... H01L 27/0218 257/506 |
| 2007/0037316 | A1 | 2/2007 | Manning et al. |
| 2008/0035956 | A1 | 2/2008 | Manning |
| 2011/0149656 | A1* | 6/2011 | Tang ................ G11C 16/0458 365/185.18 |
| 2012/0326214 | A1 | 12/2012 | Cho |
| 2014/0241025 | A1 | 8/2014 | Wang et al. |

* cited by examiner

METHODS OF FORMING CONTACTS FOR A SEMICONDUCTOR DEVICE STRUCTURE, AND RELATED METHODS OF FORMING A SEMICONDUCTOR DEVICE STRUCTURE

TECHNICAL FIELD

Embodiments of the disclosure relate to the field of semiconductor device design and fabrication. More specifically, embodiments of the disclosure relate to methods of forming contacts for semiconductor device structures, to related methods of forming semiconductor device structures, and to related semiconductor device structures.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is the resistance of the contacts associated therewith. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored. As the dimensions of memory device (e.g., DRAM device) features decrease, the dimensions of the contacts associated therewith also decrease, resulting in increased contact resistance. Increased contact resistance decreases the drive current of the memory device, which can adversely affect memory device performance.

One approach toward decreasing contact resistance within a memory device has been to increase the surface area of the contacts thereof. For example, material may be removed from multiple surfaces of a memory device feature to form a three dimensional (3D) contact exhibiting greater contact surface area than the memory device feature would otherwise exhibit. Unfortunately, conventional methods of forming such 3D contacts can suffer from a variety of problems. For example, conventional methods of forming 3D contacts for a DRAM device structure exhibiting lower critical dimensions, such as critical dimensions less than about 20 nanometers (nm), can require complex and costly processes to sufficiently form and align 3D storage node contacts relative to digit line contacts to ensure proper performance of the DRAM device. If, for example, a contact hole in which a digit line contact (e.g., a doped polysilicon plug) is formed does not completely expose an active area of a semiconductive pillar associated with the digit line contact, or extends into storage node contact regions of neighboring semiconductive pillars, the DRAM device may short during use and operation. In addition, conventional methods of forming 3D contacts for a DRAM device structure may also require increased feature dimensions, such as thicker nitride caps over digit lines, to account for material (e.g., silicon nitride) loss associated with dry etching processes (e.g., reactive ion etching processes) required to form the 3D contacts.

A need, therefore, exists for new, simple, and cost-efficient methods of forming contacts for a semiconductor device structure, such as, for example, a DRAM device structure including features having critical dimensions less than about 20 nm.

DETAILED DESCRIPTION

Figure 1A:
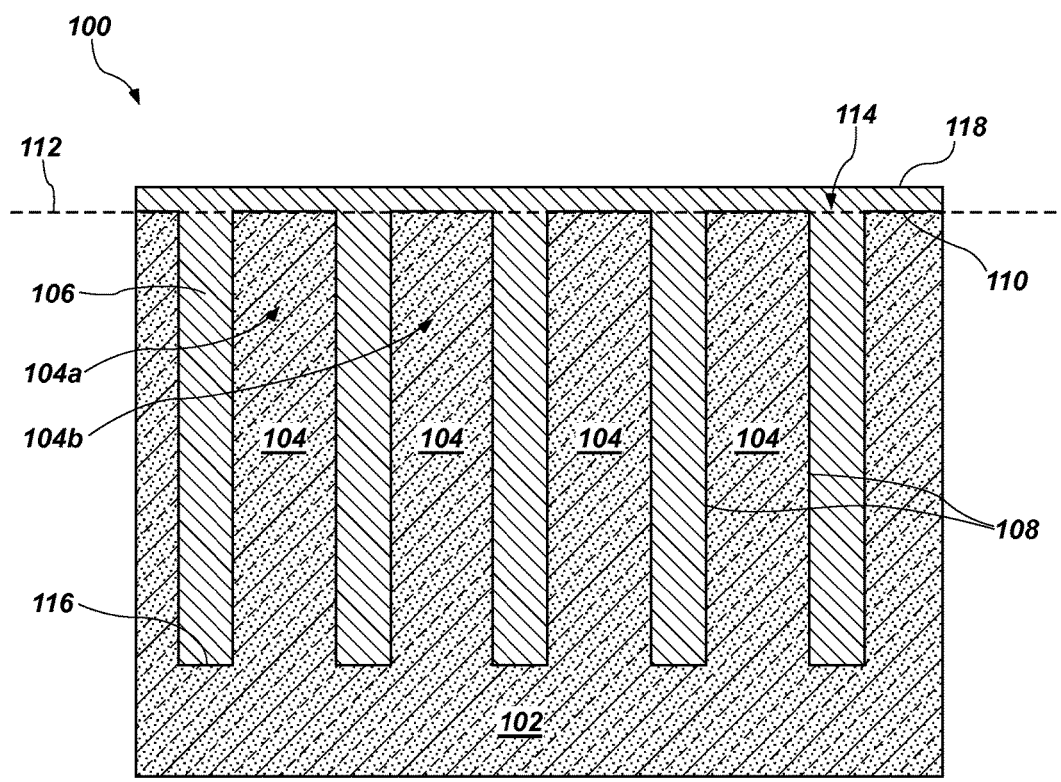
FIGS. 1A through 10B are cross-sectional (i.e., FIGS. 1A, 2A, 3A, 4A, 5A, 6A, 7A, 8A, 9A, and 10A) and top-down (i.e., FIGS. 1B, 2B, 3B, 4B, 5B, 6B, 7B, 8B, 9B, and 10B) views illustrating a method of forming contacts for a semiconductor device structure, in accordance with embodiments of the disclosure.

Methods of forming contacts for a semiconductor device structure are disclosed, as are related methods of forming semiconductor device structures, and related semiconductor device structures. In some embodiments, a method of forming contacts for a semiconductor device structure includes forming contact holes extending into each of semiconductive pillars, an isolation material between the semiconductive pillars, and nitride caps of nitride-capped electrodes (e.g., nitride-capped wordlines) extending through the semiconductive pillars. The contact holes may be centered about active areas (e.g., digit line contact regions) of the semiconductive pillars, and may extend into portions (e.g., storage node contact regions) of neighboring semiconductive pillars. Composite structures are formed within the contact holes and include oxide structures over sidewalls of the contact holes and nitride structures over the oxide structures. The oxide structures and the nitride structures may be formed simultaneously or may be formed sequentially. Conductive structures (e.g., digit line contact plugs) are formed over inner sidewalls of the composite structures, and may fill remaining portions of the contact holes. Additional nitride-capped electrodes (e.g., nitride-capped digit lines) may be formed over the conductive structures and may extend substantially perpendicular to the nitride-capped electrodes. Pairs of nitride spacers may be formed over opposing sidewalls of the additional nitride-capped electrodes and may be separated from neighboring pairs of nitride spacers by apertures extending to upper surfaces of the portions (e.g., the storage node contact regions) of the neighboring semiconductive pillars. Portions of the oxide structures are selectively removed to expose sidewalls of the portion of the neighboring semiconductive pillars. The methods disclosed herein may decrease processing complexity, the number of processing acts, and cost relative to conventional methods of forming contacts for a semiconductor device structure. The methods of the disclosure may facilitate increased feature density, providing enhanced performance in semiconductor device structures (e.g., DRAM device structures, such as DRAM cells) and semiconductor devices (e.g., DRAM devices) that rely on high feature density.

The following description provides specific details, such as material types, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device. The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "configured" refers to a size, shape, material composition, and arrangement of one or more of at least one structure and at least one apparatus facilitating operation of one or more of the structure and the apparatus in a pre-determined way.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

FIGS. 1A through 10B, are simplified cross-sectional (i.e., FIGS. 1A, 2A, 3A, 4A, 5A, 6A, 7A, 8A, 9A, and 10A) and top-down (i.e., FIGS. 1B, 2B, 3B, 4B, 5B, 6B, 7B, 8B, 9B, and 10B) views illustrating embodiments of a method of forming contacts for a semiconductor device structure, such as a DRAM device structure. With the description provided below, it will be readily apparent to one of ordinary skill in the art that the methods described herein may be used in various devices. In other words, the methods of the disclosure may be used whenever it is desired to form a semiconductor device structure.

Figure 1B:
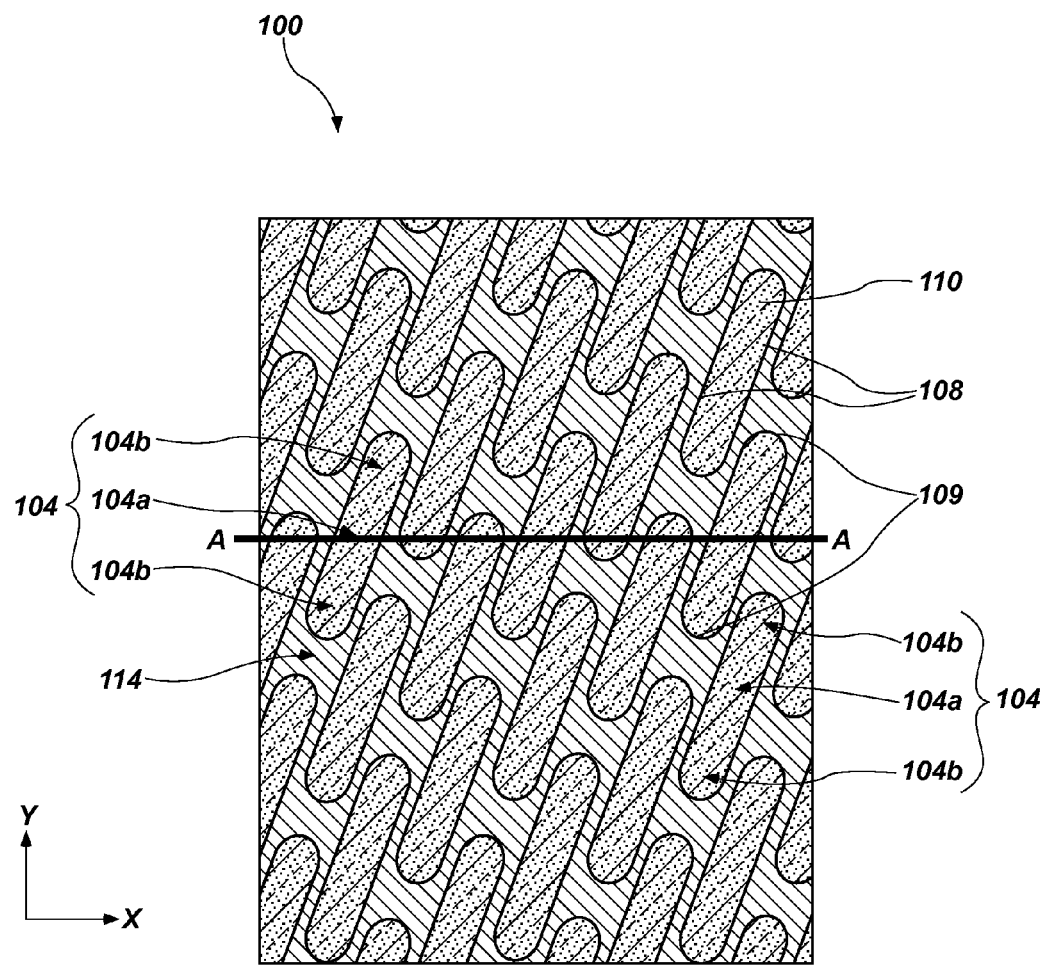

Referring to FIG. 1A, a semiconductor device structure 100 may include a semiconductive base 102, semiconductive pillars 104 longitudinally extending from and integral with the semiconductive base 102, and an isolation material 106 covering surfaces of the semiconductive base 102 and the semiconductive pillars 104. As used herein, each of the terms "longitudinal" and "vertical" means and includes extending in a direction substantially perpendicular to the semiconductive base 102, regardless of the orientation of the semiconductive base 102. Accordingly, as used herein, each of the terms "lateral" and "horizontal" means and includes extending in a direction substantially parallel to the semiconductive base 102, regardless of the orientation of the semiconductive base 102. FIG. 1B is a top-down view of the semiconductor device structure 100 at the processing stage shown in FIG. 1A, wherein a line A-A corresponds to the cross-section of the semiconductor device structure 100 depicted in FIG. 1A. For clarity in illustrating the semiconductive pillars 104, the isolation material 106 is absent from (i.e., not depicted in) FIG. 1B. As shown in FIG. 1B, the line A-A may extend in a direction offset from a direction running perpendicular to a direction in which the semiconductive pillars 104 extend, such as a direction about twenty-one (21) degrees offset from a direction extending perpendicular to the direction in which the semiconductive pillars 104 extend.

The semiconductive base 102 and the semiconductive pillars 104 may each be formed of and include a semiconductive material including, but not limited to, at least one of a silicon material, a silicon-germanium material, a germanium material, a gallium arsenide material, a gallium nitride material, and an indium phosphide material. In some embodiments, the semiconductive base 102 and the semiconductive pillars 104 are formed of and include at least one silicon material. As used herein, the term "silicon material" means and includes a material that includes elemental silicon or a compound of silicon. The semiconductive base 102 and the semiconductive pillars 104 may, for example, be formed of and include monocrystalline silicon, polysilicon, or combinations thereof.

Referring collectively to FIGS. 1A and 1B, each of the semiconductive pillars 104 may exhibit an elongate lateral cross-sectional shape (see FIG. 1B), such an oblong lateral cross-sectional shape. The semiconductive pillars 104 may each include opposing sidewalls 108, opposing ends 109 (FIG. 1B), and an upper surface 110. The upper surfaces 110 of the semiconductive pillars 104 may share a common plane 112, depicted as a dotted line in FIG. 1A (e.g., the upper surfaces 110 of the semiconductive pillars 104 may be substantially coplanar with one another). In addition, as shown in FIG. 1B, each of the semiconductive pillars 104 may include a digit line contact region 104a and storage node contact regions 104b (e.g., cell contact regions). The storage node contact regions 104b may be located proximate the opposing ends 109 of each of the semiconductive pillars 104, and the digit line contact region 104a may be located between the storage node contact regions 104b and proximate a center of each of the semiconductive pillars 104. The digit line contact region 104a and the storage node contact regions 104b of the semiconductive pillars 104 may subsequently be separated from one another by isolation trenches having wordlines and nitride caps formed therein, as described in further detail below. For neighboring (e.g., adjacent) semiconductive pillars 104, the digit line contact region 104a of one of the neighboring semiconductive pillar 104 may be located laterally adjacent one of the storage node contact regions 104b of the other of the neighboring semiconductive pillars 104.

As shown in FIGS. 1A and 1B, the semiconductive pillars 104 may each exhibit substantially the same dimensions (e.g., length, width, height) and spacing. In additional embodiments, at least one of the semiconductive pillars 104 may have at least one different dimension (e.g., a different length, a different width, a different height) than at least one other of the semiconductive pillars 104, and/or the spacing between at least one pair of neighboring semiconductive pillars 104 may be different than the spacing between at least one other pair of neighboring semiconductive pillars 104. The dimensions and spacing of the semiconductive pillars 104 may be selected to provide desired dimensions and spacing to one or more subsequently formed features (e.g., structures, spacers, contact plugs, digit lines) of the semiconductor device structure 100, as described in further detail below. In some embodiments, each of the semiconductive pillars 104 exhibits a minimum width of less than or equal to about 100 nanometers (nm) (e.g., less than or equal to about 18 nm), and a minimum distance (e.g., spacing) between neighboring semiconductive pillars 104 is less than or equal to about 100 nm (e.g., less than or equal to about 18 nm).

With continued reference to FIGS. 1A and 1B, the semiconductive pillars 104 are separated from one another by filled isolation trenches 114 at least partially containing the isolation material 106 (FIG. 1A). As shown in FIG. 1A, the filled isolation trenches 114 longitudinally extend from the upper surfaces 110 of the semiconductive pillars 104 to an upper surface 116 of the semiconductive base 102. The height of the semiconductive pillars 104 may correspond to a depth of the filled isolation trenches 114, and the minimum distance between neighboring semiconductive pillars 104 may correspond to the minimum width of a filled isolation trench 114 therebetween.

Referring to FIG. 1A, the isolation material 106 may cover (e.g., physically contact and extend across) the upper surface 116 of the semiconductive base 102, and the opposing sidewalls 108, the opposing ends 109 (FIG. 1B), and the upper surface 110 of each of the semiconductive pillars 104. For example, as shown in FIG. 1A, the isolation material 106 may substantially fill the filled isolation trenches 114, and may also protrude (e.g., extend) beyond longitudinal and lateral boundaries of the filled isolation trenches 114 to substantially cover the upper surfaces 110 of the semiconductive pillars 104. An upper surface 118 of the isolation material 106 may be substantially non-coplanar with the common plane 112 shared by the upper surfaces 110 of the semiconductive pillars 104. The upper surface 118 of the isolation material 106 may be substantially planar, or may be at least partially non-planar. The isolation material 106 may comprise at least one dielectric material, such as an oxide material (e.g., silicon dioxide, phosphosilicate glass, borosilicate glass, borophosphosilicate glass, fluorosilicate glass, aluminum oxide, a combination thereof), a nitride material (e.g., silicon nitride), an oxynitride material (e.g., silicon oxynitride), amphorous carbon, or a combination thereof. In some embodiments, the isolation material 106 is a silicon oxide (e.g., silicon dioxide).

The semiconductive device structure 100, including the semiconductive base 102, the semiconductive pillars 104, and the isolation material 106 may be formed using conventional processes and conventional processing equipment, which are not described in detail herein. By way of non-limiting example, a semiconductive material may be conventionally formed (e.g., through at least one of in situ growth, spin-on coating, blanket coating, chemical vapor deposition, plasma enhanced chemical vapor deposition, atomic layer deposition, and physical vapor deposition) and patterned (e.g., masked, photoexposed, developed, and etched) to form the semiconductive base 102 and the semiconductive pillars 104, and then the isolation material 106 may be conventionally formed (e.g., deposited and planarized) thereover.

Figure 2A:
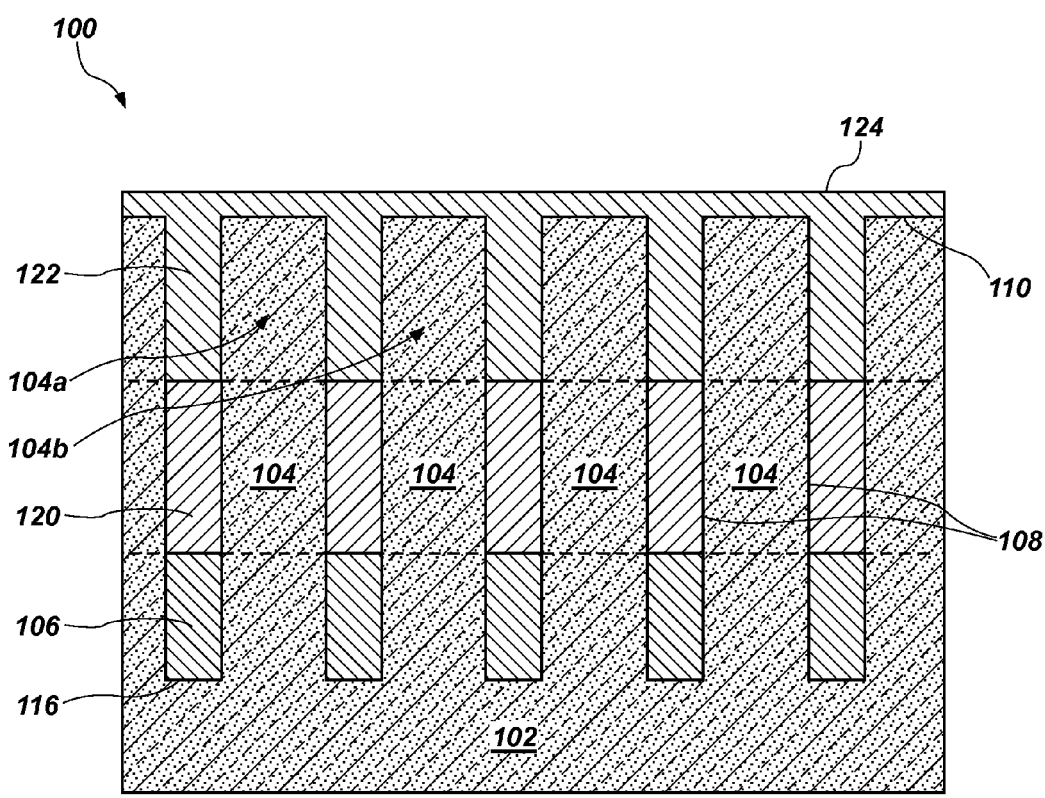
Figure 2B:
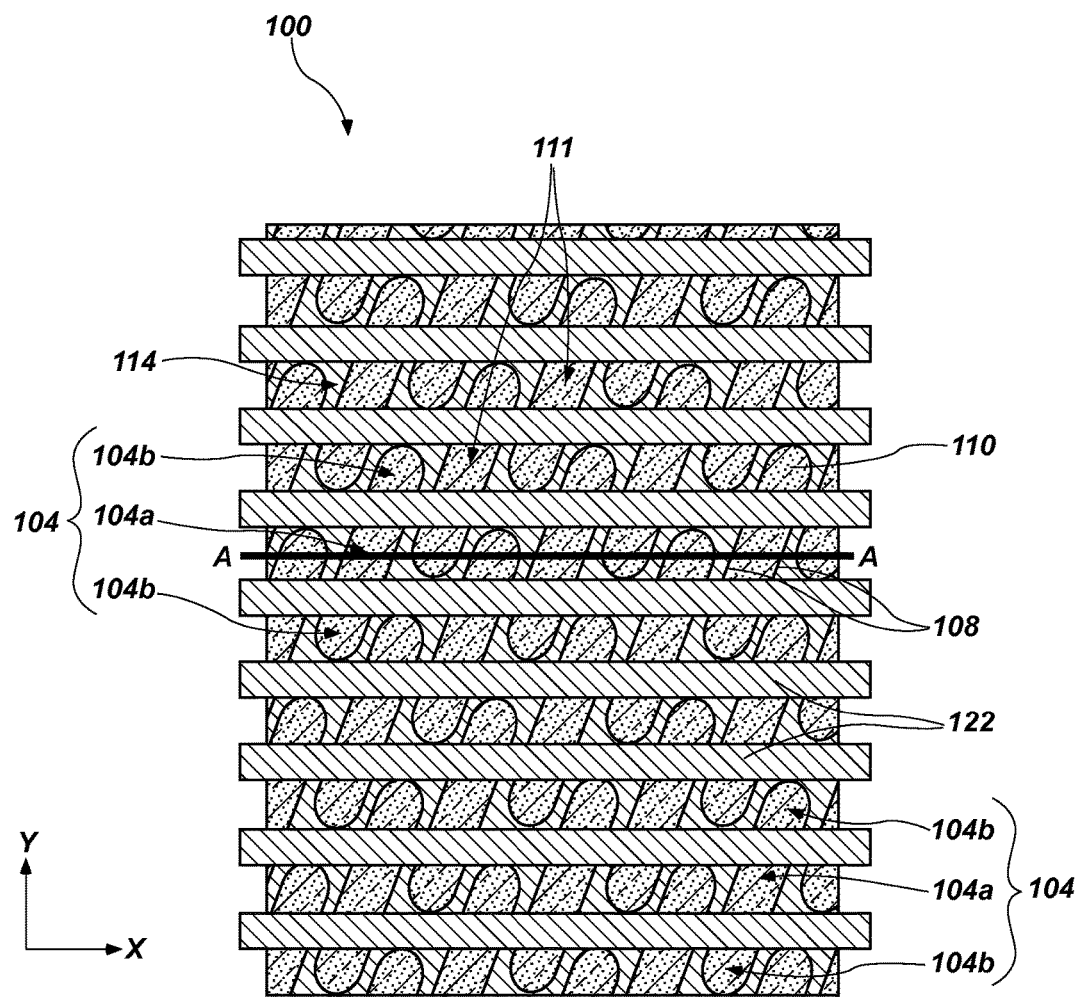

Referring next to FIG. 2A, portions of each of the semiconductive pillars 104 and portions of the isolation material 106 may be removed (e.g., etched) to form additional trenches (not shown), wordlines 120 (e.g., electrodes) may be formed within the additional trenches, and nitride caps 122 may be formed on or over the wordlines 120 within the additional trenches. As shown in FIG. 2B, which is a top-down view of the semiconductor device structure 100 at the processing stage shown in FIG. 2A (with the isolation material 106 absent for clarity), the additional trenches, the wordlines 120 (FIG. 2A), and the nitride caps 122 each may extend in a direction offset from a direction running perpendicular to a direction in which the semiconductive pillars 104 extend, such as a direction about twenty-one (21) degrees offset from a direction running perpendicular to the direction in which the semiconductive pillars 104 extend. Each of the semiconductive pillars 104 may include two neighboring wordlines 120 and two neighboring nitride caps 122 extending therethrough. The neighboring nitride caps 122 may be positioned between and separate the digit line contact region 104a and the storage node contact regions 104b of each of the semiconductive pillars 104. As shown in FIG. 2B, the position and orientation of the neighboring nitride caps 122 relative to the semiconductive pillars 104 may define parallelogram-shaped active areas 111 centrally positioned along the lengths of the semiconductive pillars 104.

Returning to FIG. 2A, the wordlines 120 may each be formed of and include an electrically conductive material including, but not limited to, a metal (e.g., tungsten, titanium, nickel, platinum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, each of the wordlines 120 may comprise at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental iridium (Ir), iridium oxide (IrO$_x$), elemental ruthenium (Ru), ruthenium oxide (RuO$_x$), alloys thereof, or combinations thereof. The wordlines 120 may each be formed to have any desired dimensions (e.g., length, width, height). The wordlines 120 may be confined within at least the longitudinal boundaries of the additional trenches in which they are formed.

The nitride caps 122 may each be formed of and include a dielectric nitride material, such as silicon nitride (Si$_3$N$_4$). The nitride caps 122 may each be formed to have any desired dimensions (e.g., length, width, height). Upper surfaces 124 of the nitride caps 122 within the additional trenches may be substantially coplanar with the upper surfaces 118 (FIG. 1A) of remaining (e.g., unremoved) portions of the isolation material 106. In additional embodiments, one or more of the upper surfaces 124 of the nitride caps 122 may be at least partially non-coplanar with the upper surfaces 118 (FIG. 1A) of remaining portions of the isolation material 106.

The additional trenches, the wordlines 120, and the nitride caps 122 may each independently be formed using conventional processes (e.g., material removal processes, such as at least one of masking processes, etching processes, and planarization processes; and deposition processes, such as at least one of atomic layer deposition processes, chemical vapor deposition processes, and physical vapor deposition processes) and conventional processing equipment, which are not described in detail herein.

Figure 3A:
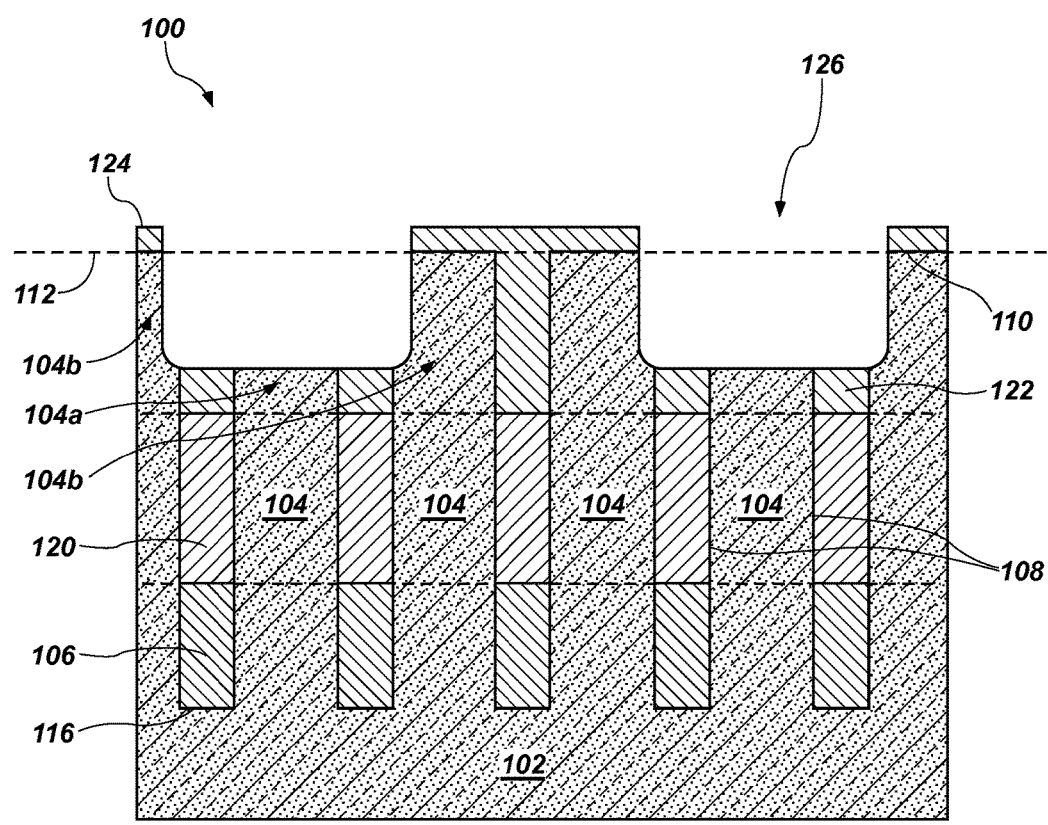

Referring next to FIG. 3A, contact holes 126 (e.g., openings) may be formed in and extend across portions of the semiconductive pillars 104, the isolation material 106, and the nitride caps 122. The size, shape, and spacing of each of the contact holes 126 may at least partially depend upon the size, shape, and spacing of the semiconductive pillars 104, as well as on the size, shape, and spacing of composite structures (e.g., spacers, collars) to be formed within the contact holes 126, as described in further detail below. As shown in FIG. 3A, for a group of three neighboring semiconductive pillars 104, a contact hole 126 may positioned, sized, and shaped to extend completely laterally across the digit line contact region 104a of one of the neighboring semiconductive pillars 104 (e.g., a central semiconductive pillar 104) and partially laterally into one of the storage node contact regions 104b of each of the other two semiconductors pillars 104 (e.g., outer semiconductive pillars 104 flanking the central semiconductive pillar 104). The contact hole 126 may laterally extend into the storage node contact regions 104b of the outer semiconductive pillars 104 of the group of three neighboring semiconductive pillars 104 any width facilitating the formation and alignment of additional structures (e.g., a contact plug, a digit line, a nitride cap) on or over the digit line contact region 104a of the central semiconductive pillar 104 using composite structures subsequently formed within the contact hole 126, as described in further detail below. A center of the contact hole 126 may be aligned with a center of the central semiconductive pillar 104 of the group of three neighboring semiconductive pillars 104. In addition, the contact holes 126 may longitudinally extend to any desired depth within one or more of the semiconductive pillars 104, the isolation material 106, and the nitride caps 122, such as a depth within a range of from about 2 nanometers (nm) to about 50 nm. The wordlines 120 may remain unexposed by the contact holes 126 (e.g., the wordlines 120 may remain covered by the nitride caps 122).

Figure 3B:
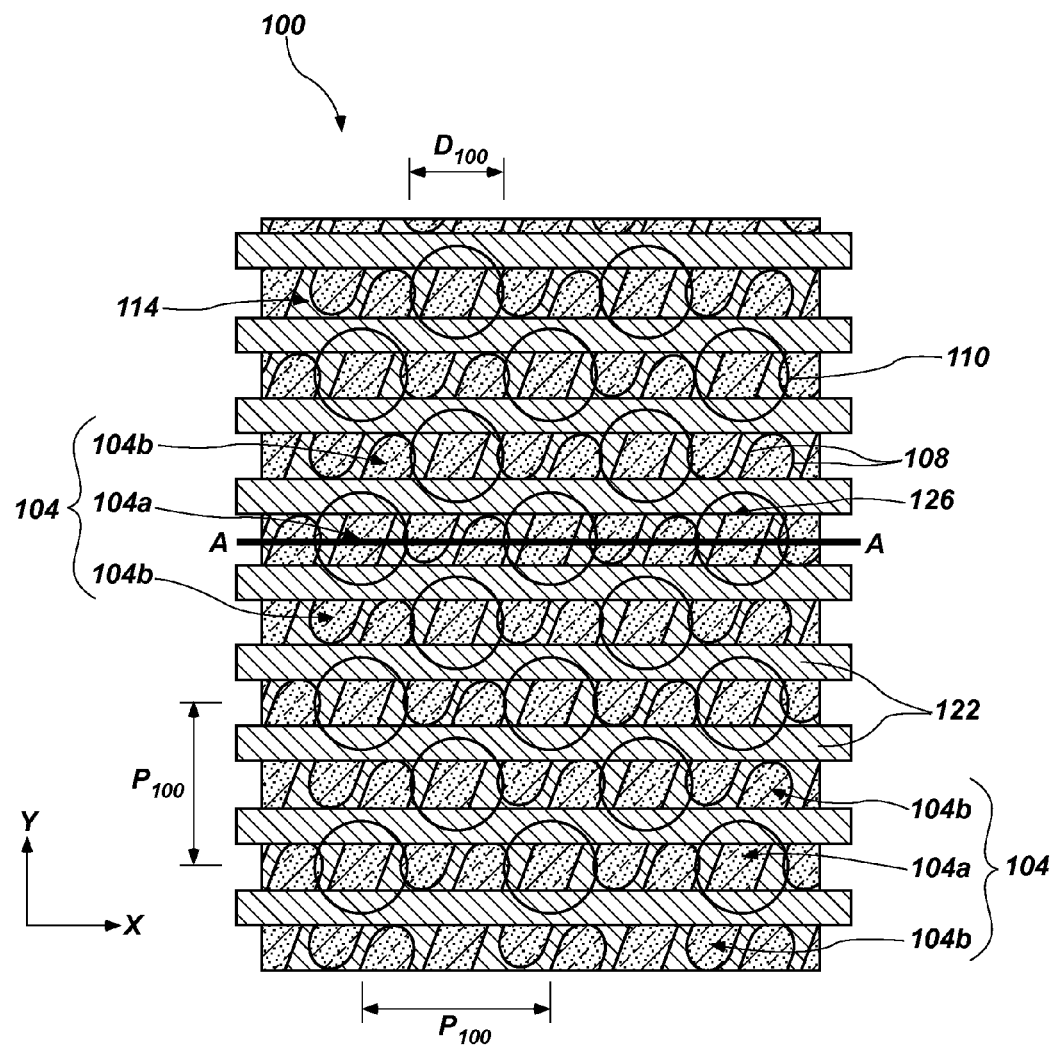

The contact holes 126 may exhibit substantially the same dimensions as one another, and may be regularly spaced apart from one another. For example, referring to FIG. 3B, which is a top-down view of the semiconductor device structure 100 at the processing stage shown in FIG. 3A, with the isolation material 106 absent for clarity, each of the contact holes 126 may exhibit a substantially circular lateral cross-sectional shape having a diameter D$_{100}$. As shown in FIG. 3B, each of the contact holes 126 may extend between and into portions of neighboring nitride caps 122. In addition, a pitch P$_{100}$ between adjacent contact holes 126 in a common row (e.g., extending in an x direction parallel to the nitride caps 122) of contact holes 126, and between adjacent contact holes 126 in a common column (e.g., extending in a y direction perpendicular to the nitride caps 122) of contact holes 126, may be substantially uniform. As a non-limiting example, the pitch P$_{100}$ between adjacent contact holes 126 of the same rows and the same columns may be about two times (2×) the diameter D$_{100}$ of each of the contact holes 126. In some embodiments, the diameter D$_{100}$ of each of the contact holes 126 is about 36 nm, and the pitch P$_{100}$ between adjacent contact holes 126 of the same rows and the same columns is about 72 nm.

The diameter D$_{100}$ of each of the contact holes 126 may be larger than that conventionally associated with the formation of contacts (e.g., digit line contacts, storage node contacts) for a semiconductor device structure (e.g., a DRAM structure). For example, for a given group of three neighboring semiconductive pillars 104, conventional contact holes are generally sized and shaped so as to not extend into (e.g., overlap) the storage node contact regions 104b of the outer semiconductors pillars 104 flanking the central semiconductive pillar 104 because extending the conventional contact holes into the storage node contact regions 104b may result in dopant diffusion during subsequent processing that may short a subsequently formed semiconductor device during use and operation. However, the methods of the disclosure, as described in further detail below, substantially prevent such dopant diffusion, facilitating the formation of contact holes 126 each exhibiting a relatively larger diameter D$_{100}$. The relatively larger diameter D$_{100}$ of each of the contact holes 126 may reduce various processing complexities (e.g., complexities associated with properly sizing and aligning various contact holes and structures) conventionally associated with the formation of contacts for a semiconductor device structure.

The contact holes 126 may be formed using conventional processes, such as conventional photolithography processes and conventional material removal processes (e.g., etching processes, such as dry etching and/or wet etching), and conventional processing equipment, which are not described in detail herein.

Figure 4A:
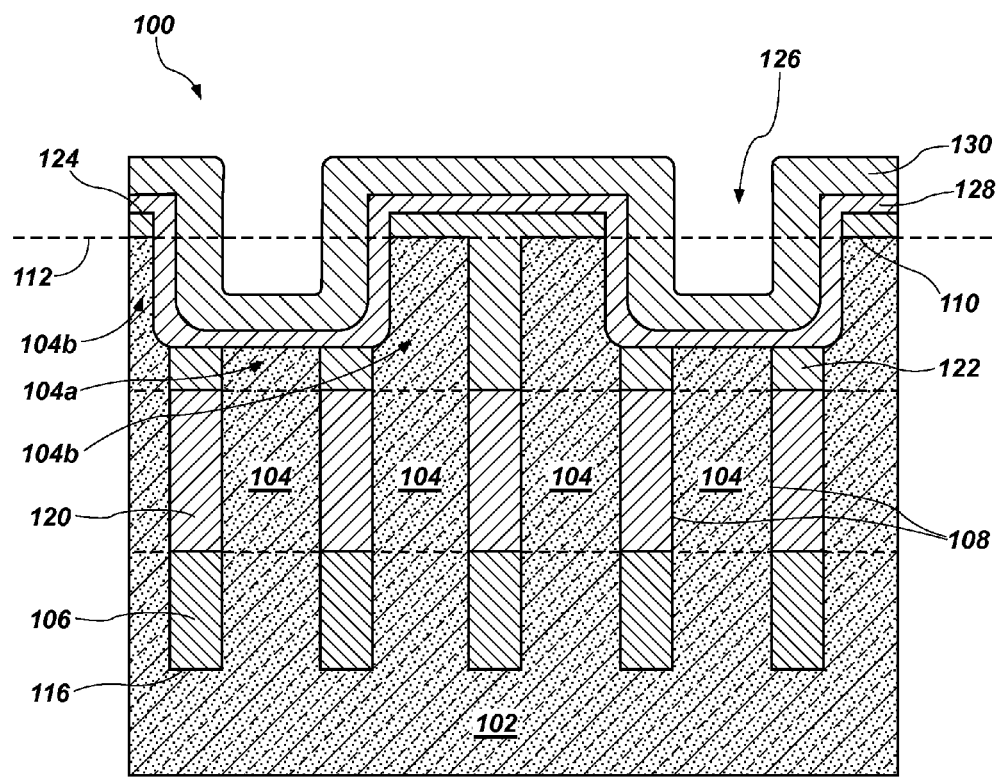

Referring next to FIG. 4A, an oxide material 128 may be formed on or over exposed surfaces of the semiconductive pillars 104, the isolation material 106, and the nitride caps 122 within and outside of the contact holes 126. The oxide material 128 may be formed substantially conformally and substantially continuously across the exposed surfaces of the semiconductive pillars 104, the isolation material 106, and the nitride caps 122 within and outside of the contact holes 126. The oxide material 128 may comprise a dielectric oxide material, such as a silicon oxide material (e.g., silicon dioxide, phosphosilicate glass, borosilicate glass, borophosphosilicate glass, or combinations thereof). In some embodiments, the oxide material 128 is silicon dioxide (SiO$_2$).

The oxide material 128 may be formed at a thickness facilitating subsequent formation of composite structures (e.g., spacers, collars) and contact plugs (e.g., digit line contact plugs) each having desired positioning and geometric configurations. For example, as described in further detail below, the thickness of the oxide material 128 may be selected relative to a thickness of a nitride material to be formed thereon or thereover so as to facilitate the formation of composite structures exhibiting dimensions permitting the formation and alignment of digit line contact plugs on or over the digit line contact regions 104a of the semiconductive pillars 104. By way of non-limiting example, the oxide material 128 may have a thickness within a range of from about 2 nm to about 8 nm, such as from about 3 nm to about 7 nm, from about 4 nm to about 6 nm, or about 5 nm. In some embodiments, the oxide material 128 has a thickness of about 5 nm. The thickness of the oxide material 128 may be substantially uniform across the exposed surfaces of the semiconductive pillars 104, the isolation material 106, and the nitride caps 122 within and outside of the contact holes 126.

The oxide material 128 may be formed on or over exposed surfaces of the semiconductive pillars 104, the isolation material 106, and the nitride caps 122 within and outside of the contact holes 126 using conventional processes and conventional processing equipment, which are not described in detail herein. By way of non-limiting example, the oxide material 128 may be formed (e.g., deposited) using physical vapor deposition ("PVD"), chemical vapor deposition ("CVD"), atomic layer deposition ("ALD"), or a combination thereof. PVD includes, but is not limited to, sputtering, evaporation, or ionized PVD. In some embodiments, the oxide material 128 is formed on or over exposed surfaces of the semiconductive pillars 104, the isolation material 106, and the nitride caps 122 within and outside of the contact holes 126 using PVD.

With continued reference to FIG. 4A, a nitride material 130 may be formed on or over exposed surfaces of the oxide material 128. The nitride material 130 may be formed substantially conformally and substantially continuously across the exposed surfaces of the oxide material 128. The nitride material 130 may comprise a dielectric nitride material, such as a silicon nitride material. The nitride material 130 may be formed of and include the same material or a different material than the nitride caps 122. In some embodiments, the nitride material 130 is formed of and include $Si_3N_4$.

The nitride material 130 may be formed at a thickness facilitating subsequent formation of composite structures (e.g., spacers, collars) and contact plugs (e.g., digit line contact plugs) each having desired positioning and geometric configurations. For example, the thickness of the nitride material 130 may be selected relative to a thickness of the oxide material 128 so as to facilitate the subsequent formation of composite structures exhibiting dimensions permitting the formation and alignment of digit line contact plugs on or over the digit line contact regions 104a of the semiconductive pillars 104. By way of non-limiting example, the nitride material 130 may have a thickness within a range of from about 17 nm to about 23 nm, from about 18 nm to about 22 nm, from about 19 nm to about 21 nm, or about 20 nm. In some embodiments, the nitride material 130 has a thickness of about 20 nm. The thickness of the nitride material 130 may be substantially uniform across the exposed surfaces of the oxide material 128.

The nitride material 130 may be formed on or over exposed surfaces of the oxide material 128 using conventional processes and conventional processing equipment, which are not described in detail herein. By way of non-limiting example, the nitride material 130 may be formed (e.g., deposited) using PVD, CVD, ALD, or a combination thereof. In some embodiments, the nitride material 130 is formed on or over exposed surfaces of oxide material 128 using PVD.

Figure 4B:
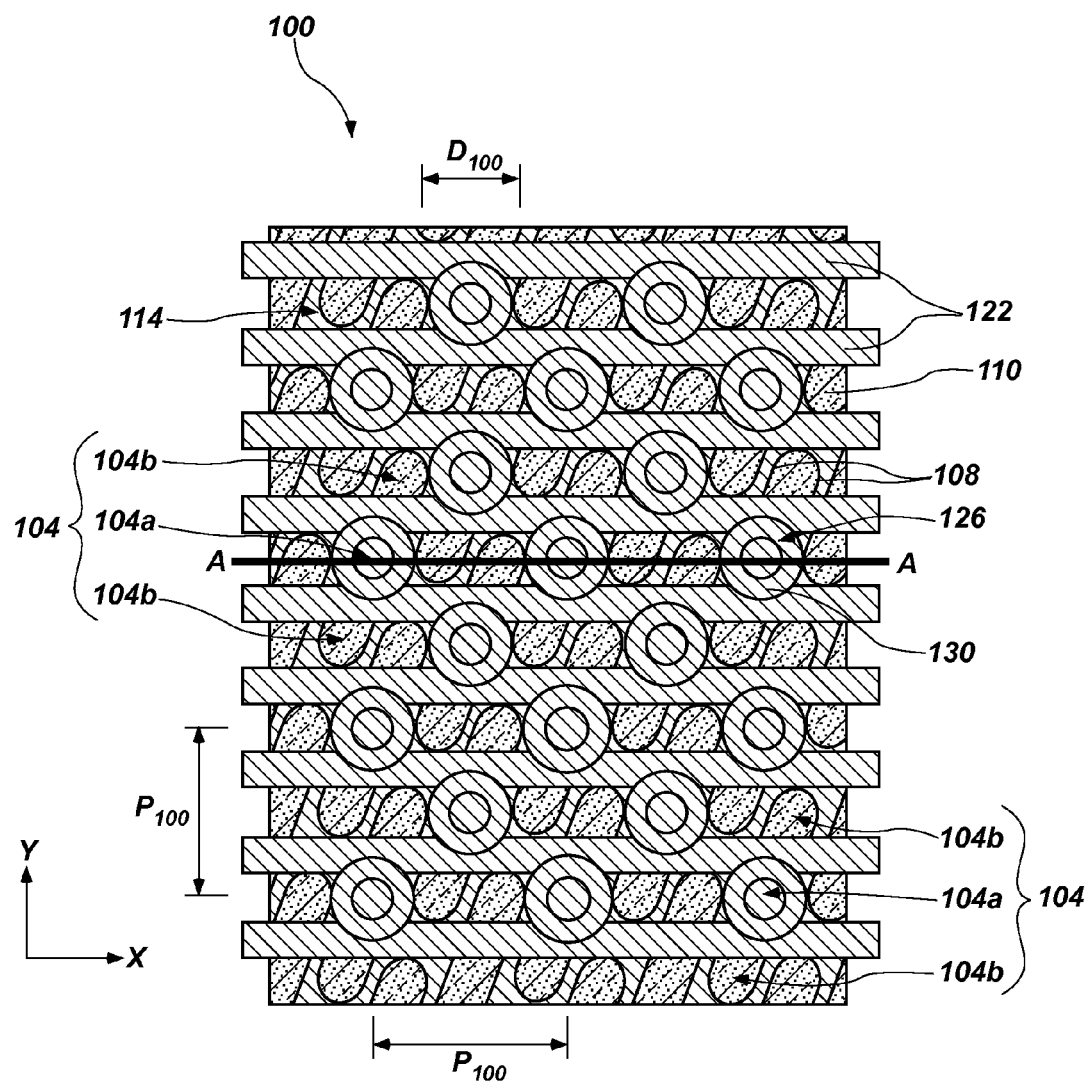

FIG. 4B is a top-down view of the semiconductor device structure 100 at the processing stage shown in FIG. 4A. For clarity, portions of the nitride material 130, the oxide material 128, the isolation material 106 outside of the contact holes 126 are absent from FIG. 4B.

Figure 5A:
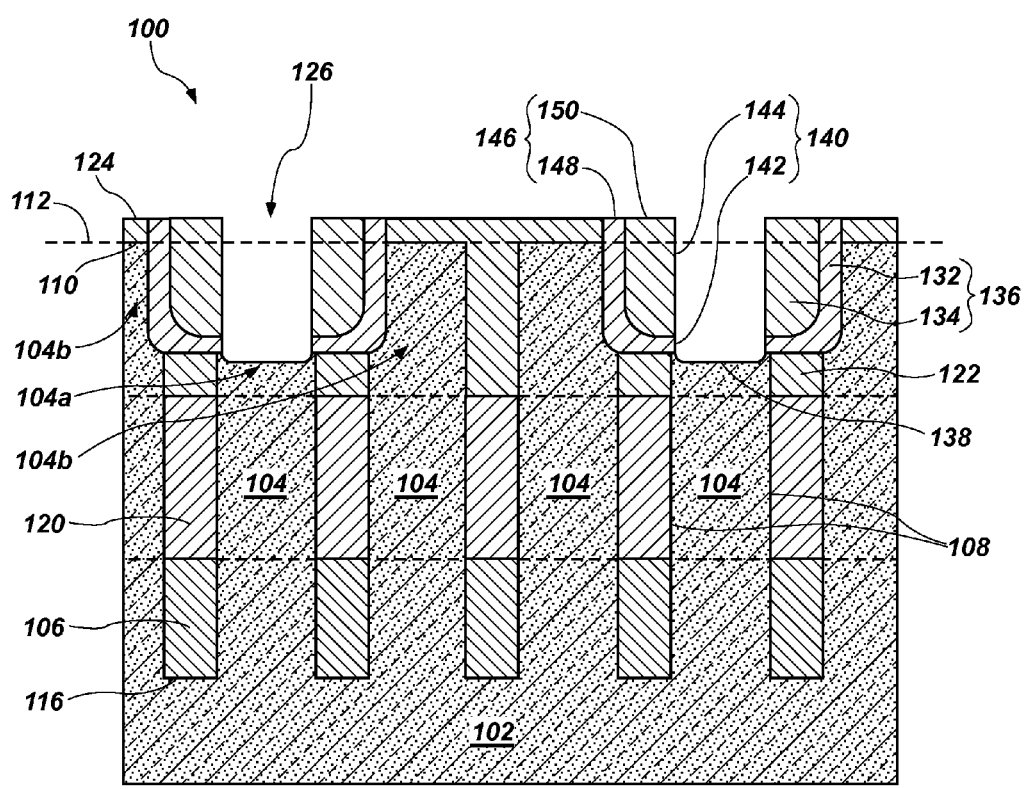

Referring to next to FIG. 5A, at least one material removal (e.g., anisotropic etching) process may be performed to remove portions of the oxide material 128 (FIG. 4A) and the nitride material 130 (FIG. 4A) and form composite structures 136 (e.g., composite spacers, composite collars) within the contact holes 126. The material removal process may substantially remove portions of the oxide material 128 and the nitride material 130 outside of the contact holes 126 as well as central portions of the oxide material 128 and the nitride material 130 within the contact holes 126 (e.g., portions of the oxide material 128 and the nitride material 130 overlying the digit line contact regions 104a of the semiconductive pillars 104) to form the composite structures 136. Peripheral portions of the oxide material 128 and the nitride material 130 within the contact holes 126 (e.g., portions of the oxide material 128 and the nitride material 130 overlying upper surfaces of the isolation material 106 and adjacent sidewalls of the storage node contact regions 104b of the semiconductive pillars 104) may be substantially maintained (e.g., not removed). The material removal process may expose upper surfaces of the isolation material 106 and the nitride caps 122 outside of the contact holes 126 and may also expose upper surfaces 138 of the digit line contact regions 104a of the semiconductive pillars 104.

As shown in FIG. 5A, each of the composite structures 136 may be formed of and include an oxide structure 132 (e.g., an oxide spacer, an oxide collar) and a nitride structure 134 (e.g., a nitride spacer, a nitride collar) on or over the oxide structure 132. The oxide structure 132 may be formed of and include a remaining (e.g., not removed) portion of the oxide material 128 (FIG. 4A), and the nitride structure 134 may be formed of and include a remaining (e.g., not removed) portion of the nitride material 130 (FIG. 4A). Accordingly, the thicknesses of the oxide structure 132 and the nitride structure 134 may correspond to the thicknesses of the oxide material 128 and the nitride material 130, respectively, and a thickness of each of the composite structures 136 may correspond to the combined thicknesses of the oxide material 128 and the nitride material 130. For example, if the oxide material 128 has a thickness of about 5 nm and the nitride material 130 has a thickness of about 20 nm, the oxide structure 132 may have a thickness of about 5 nm, the nitride structure 134 may have a thickness of about 20 nm, and the composite structure 136 may have a thickness of about 25 nm.

Figure 5B:
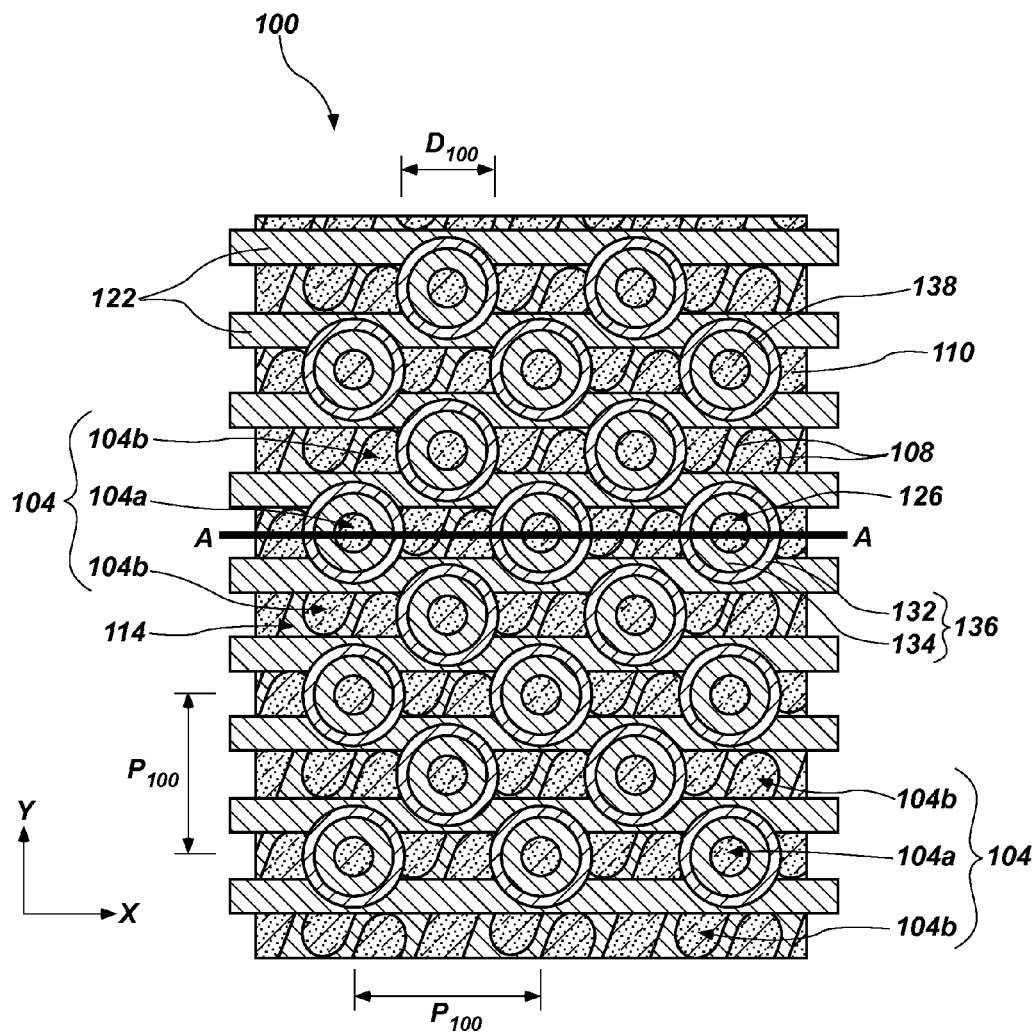

Each of the composite structures 136 may exhibit an annular shape within each of the contact holes 126. Inner sidewalls 140 of each of the composite structures 136 may be formed of and include inner sidewalls 142 of the oxide structure 132 and inner sidewalls 144 of the nitride structure 134. The inner sidewalls 142 of the oxide structure 132 may be substantially coplanar with the inner sidewalls 144 of the nitride structure 134. The inner sidewalls 140 of the composite structures 136 may align remaining (e.g., unfilled) portions of the contact holes 126 with the digit line contact regions 104a of the semiconductive pillars 104. In some embodiments, the inner sidewalls 140 of the composite structures 136 are substantially coplanar with the opposing sidewalls 108 of the semiconductive pillars 104 underlying the composite structures 136. In additional embodiments, the inner sidewalls 140 of the composite structures 136 are at least partially offset from (e.g., laterally inward from, laterally outward from) the opposing sidewalls 108 of the semiconductive pillars 104 underlying the composite structures 136. In addition, an upper surface 146 of each of the composite structures 136 may be formed of and include an upper surface 148 of the oxide structure 132 and an upper surface 150 of the nitride structure 134 associated therewith. The upper surfaces 148 of the oxide structures 132 may be substantially coplanar with the upper surfaces 150 of the nitride structures 134. In some embodiments, the upper surfaces 146 of the composite structures 136 are substantially coplanar with the upper surfaces of the isolation material 106 and the nitride caps 122 outside of the contact holes 126. In additional embodiments, the upper surfaces 146 of the composite structures 136 are at least partially offset from (e.g., longitudinally below, longitudinally above) the upper surfaces of the isolation material 106 and the nitride caps 122 outside of the contact holes 126. FIG. 5B is a top-down view of the semiconductor device structure 100 at the processing stage shown in FIG. 5A. For clarity, the isolation material 106 is absent from (i.e., not depicted in) FIG. 5B.

Figure 6A:
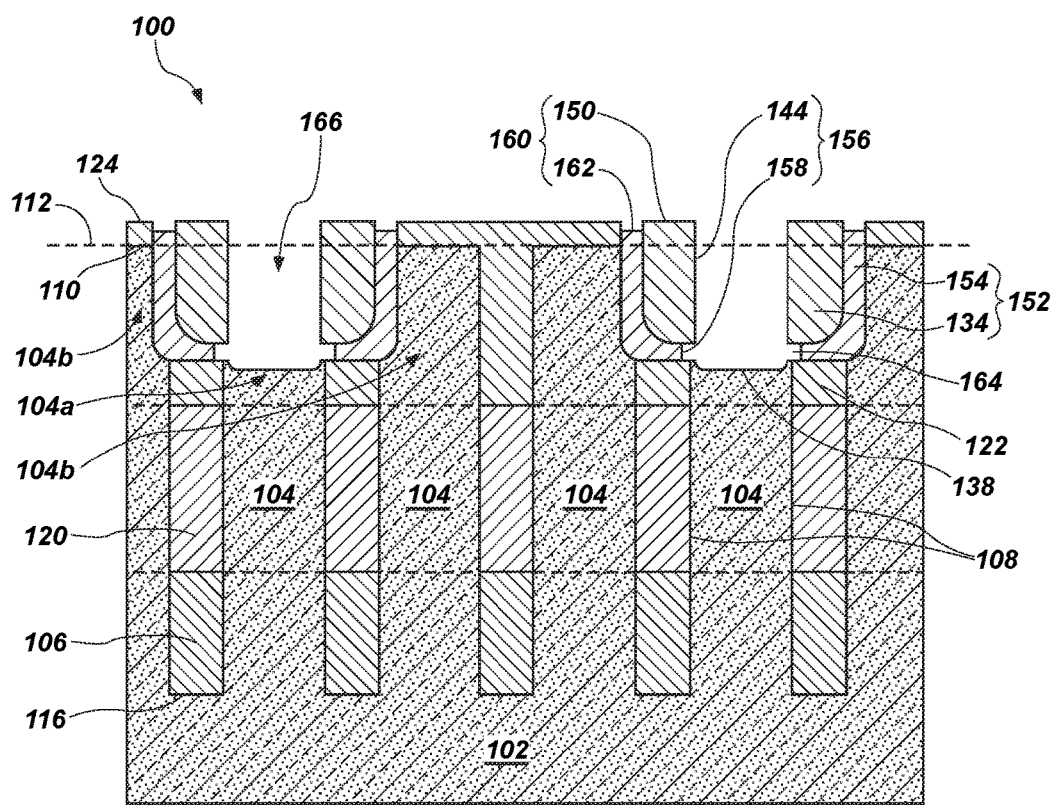
Figure 6B:
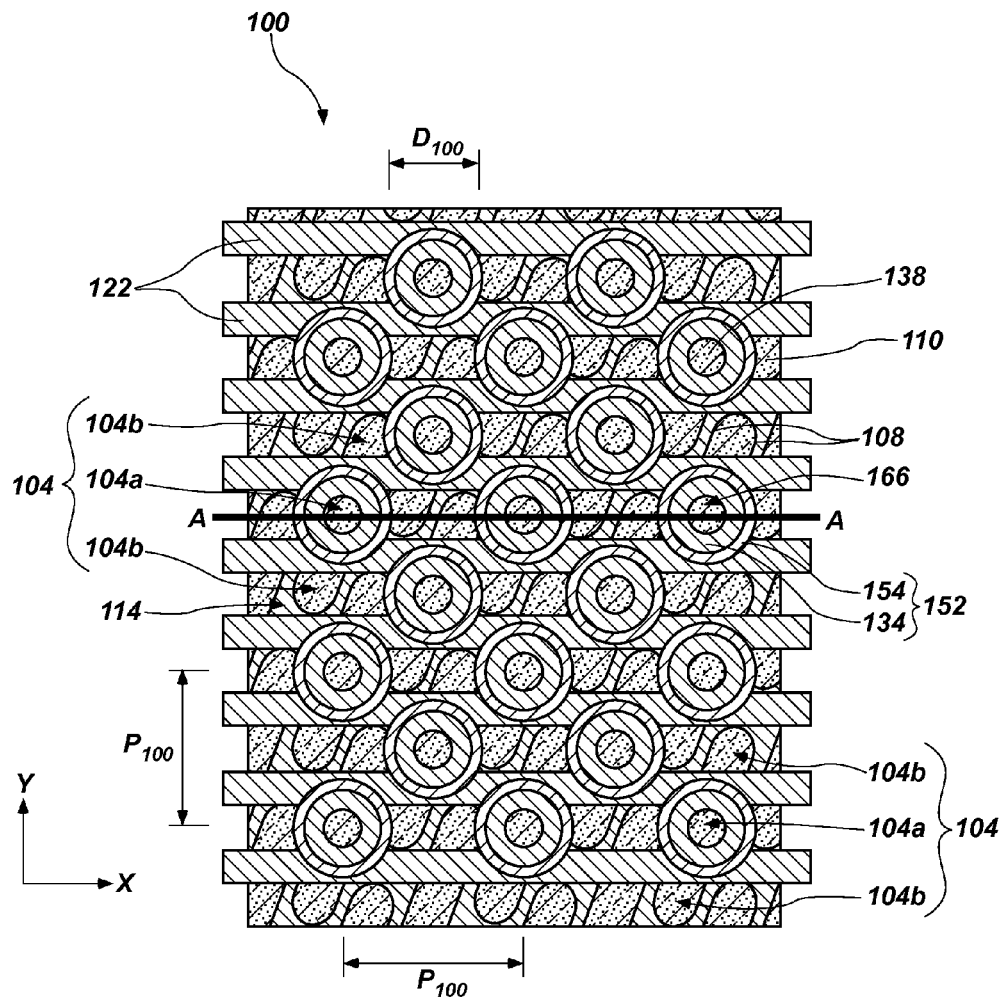

Referring next to FIG. 6A, surfaces of the composite structures 136 (FIG. 5A) (e.g., the inner sidewalls 140 of the composite structures 136, and the upper surfaces 146 of the composite structures 136), the semiconductive pillars 104 (e.g., the upper surfaces 138 of the digit line contact regions 104a of the semiconductive pillars 104), the isolation material 106, and the nitride caps 122 may be subjected to at least one cleaning process. The cleaning process may remove oxide material (e.g., $SiO_2$) on the upper surfaces 138 of the digit line contact regions 104a of the semiconductive pillars 104, and may also remove portions of the oxide structures 132 (FIG. 5A) to form modified composite structures 152 including modified inner sidewalls 156 and modified upper surfaces 160. The cleaning process may also recess remaining portions of the upper surface 118 (FIG. 1A) of the isolation material 106. As shown in FIG. 6A, the modified composite structures 152 may be formed of and include modified oxide structures 154 exhibiting recessed inner sidewalls 158 and recessed upper surfaces 162. The recessed inner sidewalls 158 of the modified oxide structures 154 may define undercut regions 164 of the modified composite structures 152 that project laterally outward beyond the inner sidewalls 144 of the nitride structures 134. The modified inner sidewalls 156 of the modified composite structures 152 and the upper surfaces 138 of the digit line contact regions 104a of the semiconductive pillars 104 may at least partially define digit line contact openings 166 for the subsequent formation of digit line contact plugs, as described in further detail below. FIG. 6B is a top-down view of the semiconductor device structure 100 at the processing stage shown in FIG. 6A. For clarity, the isolation material 106 is absent from (i.e., not depicted in) FIG. 6B.

The cleaning process may include treating the semiconductive device structure 100 with at least one etchant formulated to selectively remove exposed portions of the oxide structures 132 (FIG. 5A), the isolation material 106, and oxide material on surfaces of the semiconductive pillars 104 (e.g., on the upper surfaces 138 of the digit line contact regions 104a of the semiconductive pillars 104) without substantially removing exposed portions of the nitride structures 134, the nitride caps 122, and the semiconductive pillars 104. By way of non-limiting example, the etchant may comprise at least one of hydrofluoric acid (HF), a buffered oxide etchant (BOE), and nitric acid ($HNO_3$). In some embodiments, the etchant comprises a solution including water and HF at a ratio within a range of from about 500:1 to about 100:1. The semiconductive device structure 100 may be exposed to the etchant using conventional processes (e.g., a vapor-coating process, a sputter-coating process, a spin-coating process, a spray-coating process, an immersion-coating process, a soaking process, combinations thereof) and conventional processing equipment, which are not described in detail herein.

Figure 7A:
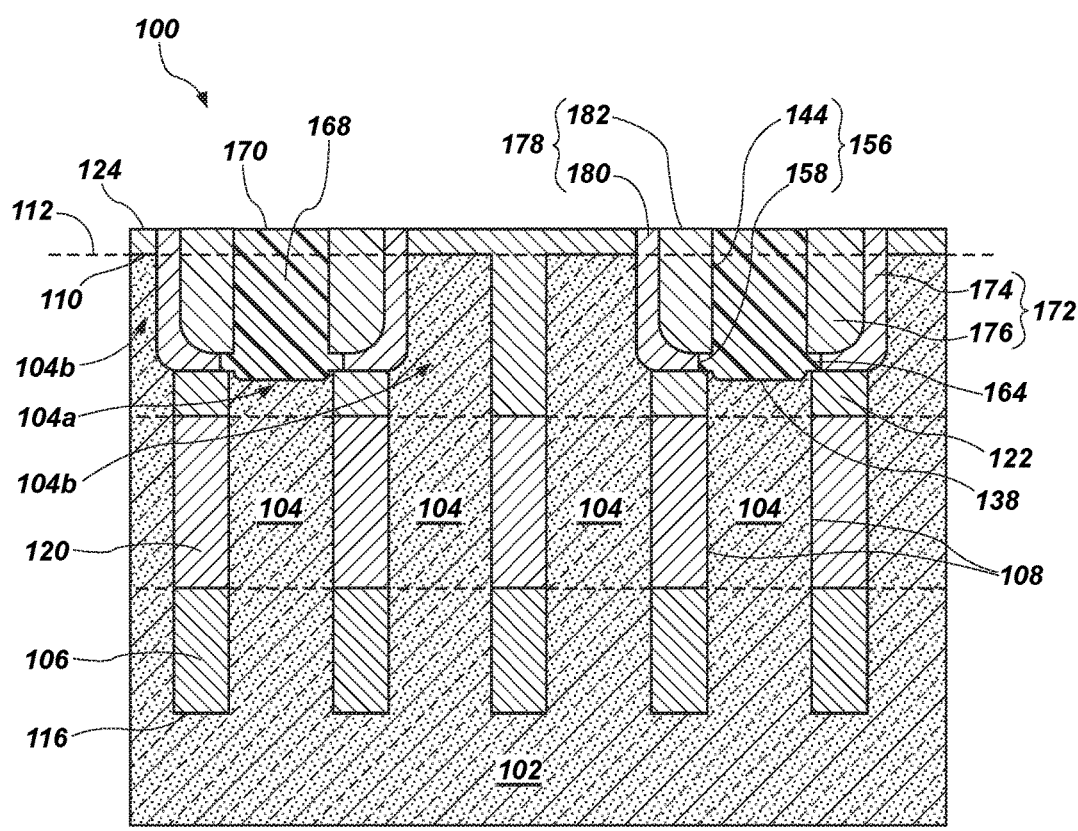
Figure 7B:
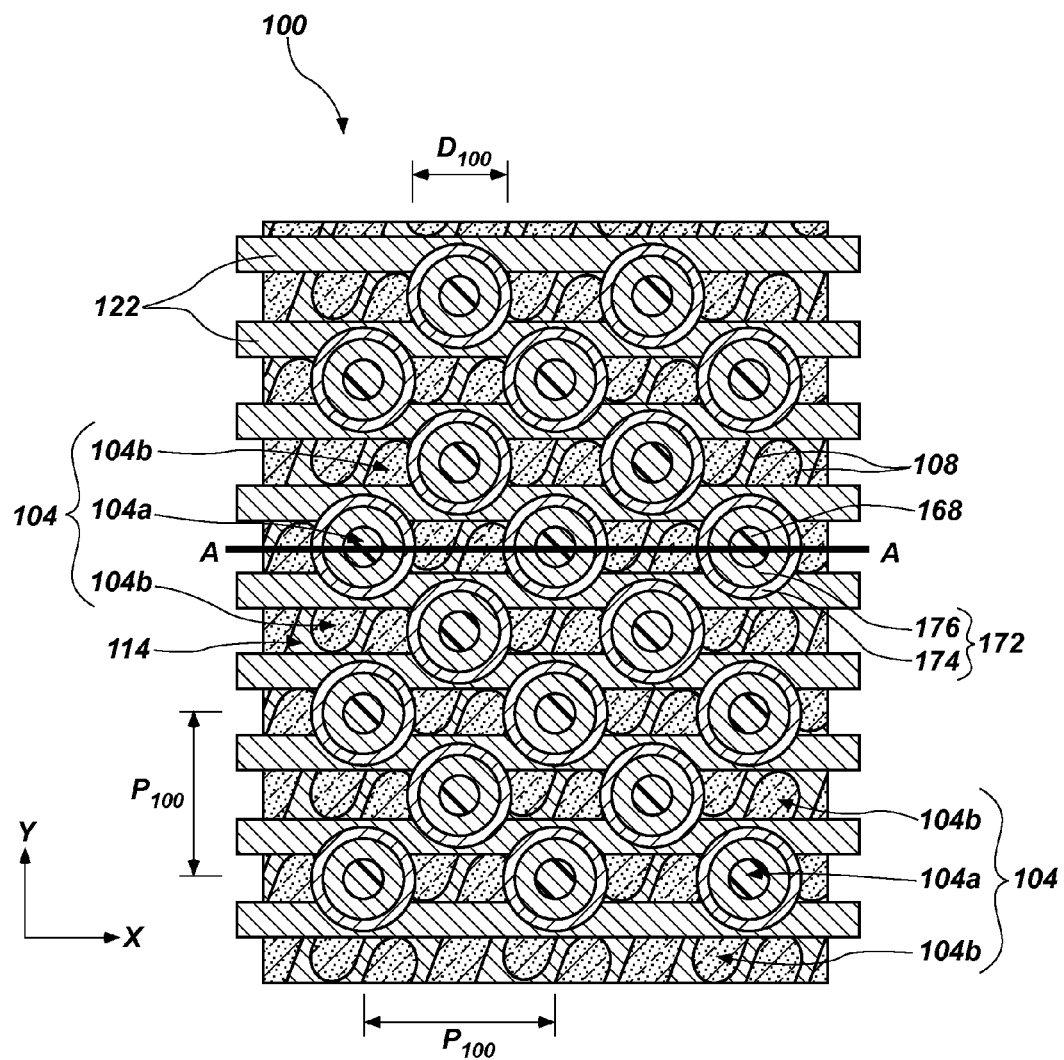

Referring next to FIG. 7A, digit line contact plugs 168 may be formed within and substantially fill the digit line contact openings 166 (FIG. 6A). The digit line contact plugs 168 may be formed of and include a conductive material, such as doped polysilicon. As depicted in FIG. 7A, the process of forming the digit line contact plugs 168 may remove upper portions of the modified composite structures 152 (e.g., upper portions of the nitride structures 134, upper portions of the modified oxide structures 154) to form planarized composite structures 172 including planarized oxide structures 174 and planarized nitride structures 176. Upper surfaces 170 of the digit line contact plugs 168 may be substantially coplanar with upper surfaces 178 of the planarized composite structures 172, including upper surfaces 180 of the planarized oxide structures 174 and upper surfaces 182 of the planarized nitride structures 176. The process of forming the digit line contact plugs 168 may also recess the upper surfaces 124 of the nitride caps 122 such that the upper surfaces 124 of the nitride caps 122 are substantially coplanar with the upper surfaces 170 of the digit line contact plugs 168 and the upper surfaces 178 of the planarized composite structures 172. FIG. 7B is a top-down view of the semiconductor device structure 100 at the processing stage shown in FIG. 7A. For clarity, the isolation material 106 is absent from (i.e., not depicted in) FIG. 7B.

The digit line contact plugs 168 may be formed using conventional processes (e.g., in situ growth processes, deposition processes, material removal processes) and conventional processing equipment, which are not described in detail herein. For example, referring to FIG. 6A, a conductive material (e.g., doped polysilicon) may be formed (e.g., grown in situ, deposited) at least within the digit line contact openings 166, and then portions of the conductive material extending (e.g., longitudinally extending, laterally extending) beyond the boundaries of the digit line contact openings 166, as well as upper portions of the modified composite structures 152 and the nitride caps 122, may be removed through at least one material removal process (e.g., an anisotropic etching process, such as a reactive ion etching (RIE) process; a planarization process, such as a chemical mechanical planarization (CMP) process) to form the digit line contact plugs 168 (and the planarized composite structures 172).

Figure 8A:
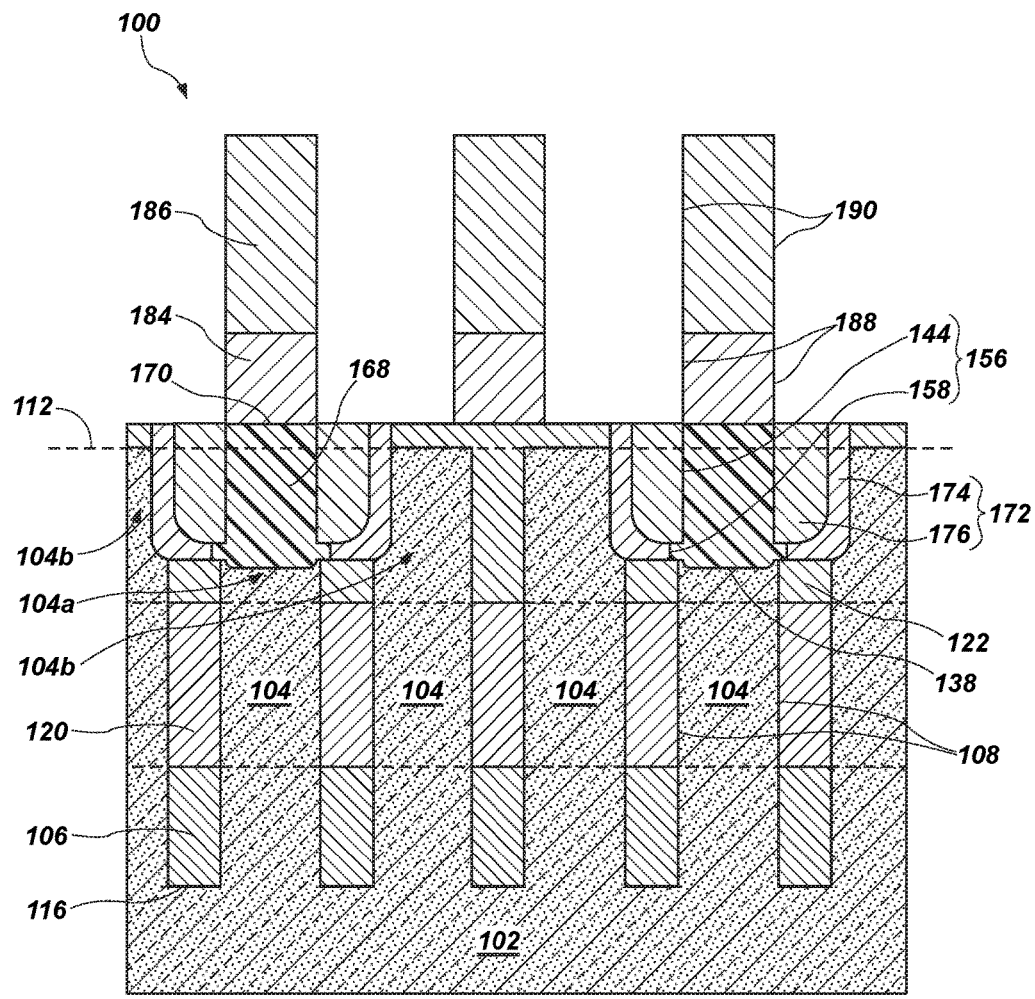
Figure 8B:
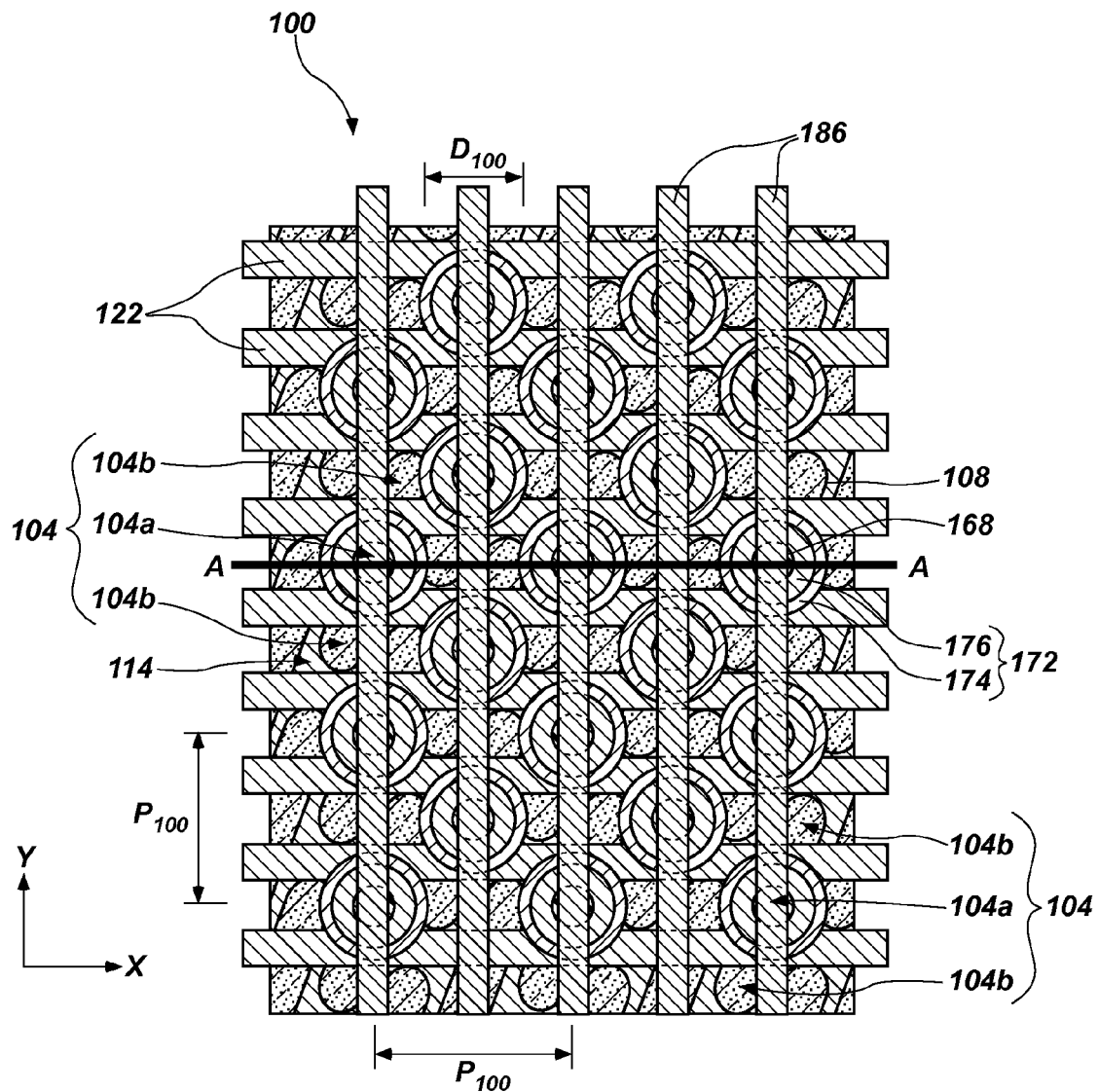

Referring next to FIG. 8A, digit lines 184 (e.g., additional electrodes) may be formed on or over the digit line contact plugs 168, and additional nitride caps 186 may be formed on or over the digit lines 184. As shown in FIG. 8B, which is a top-down view of the semiconductor device structure 100 at the processing stage shown in FIG. 8A (with the isolation material 106 absent for clarity), the digit lines 184 (FIG. 8A) and the additional nitride caps 186 thereabove each may extend in a direction (e.g., the y direction) substantially perpendicular (e.g., orthogonal) to the direction (e.g., the x direction) in which the wordlines 120 (FIG. 8A) and the nitride caps 122 extend.

Returning to FIG. 8A, the digit lines 184 may each be formed of and include an electrically conductive material including, but not limited to, a metal (e.g., tungsten, titanium, nickel, platinum, gold), a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), or combinations thereof. By way of non-limiting example, each of the digit lines 184 may be formed of and include at least one of TiN, TaN, WN, TiAlN, Ti, Pt, Rh, Ir, IrO$_x$, Ru, RuO$_x$, alloys thereof, or combinations thereof.

The digit lines 184 may directly contact and extend over and between neighboring digit line contact plugs 168 extending in a direction (e.g., the y direction shown in FIG. 8B) substantially perpendicular to the direction (e.g., the x direction shown in FIG. 8B) in which the wordlines 120 and the nitride caps 122 extend. The digit lines 184 may be substantially aligned with the digit line contact plugs 168 thereunder. For example, as shown in FIG. 8A, opposing sidewalls 188 of each of the digit lines 184 may be at least partially (e.g., substantially) coplanar with at least a portion of the opposing sidewalls of the digit line contact plugs 168 thereunder (e.g., the opposing sidewalls 188 of each of the digit lines 184 may be substantially coplanar with at least the inner sidewalls 144 of the planarized nitride structures 176 defining a portion of the opposing sidewalls of the digit line contact plugs 168). In additional embodiments, the digit lines 184 may be substantially aligned with the digit line contact plugs 168, but the opposing sidewalls 188 of each of the digit lines 184 may be substantially non-coplanar with (e.g., laterally offset from, such as laterally inward from, or laterally outward from) the opposing sidewalls of the digit line contact plugs 168 thereunder.

The additional nitride caps 186 may each be formed of and include a dielectric nitride material, such as Si$_3$N$_4$. The material composition of the additional nitride caps 186 may be the same as or may be different than the material composition of the nitride caps 122. In some embodiments, the additional nitride caps 186 are formed of and include Si$_3$N$_4$. The additional nitride caps 186 may each be formed to have any desired dimensions (e.g., length, width, height). As shown in FIG. 8A, opposing sidewalls 190 of the additional nitride caps 186 may be substantially coplanar with the opposing sidewalls 188 of the digit lines 184 thereunder. Accordingly, the additional nitride caps 186 may also be substantially aligned with the digit line contact plugs 168 thereunder.

The digit lines 184 and the additional nitride caps 186 may each independently be formed using conventional processes (e.g., material deposition processes, such as at least one of ALD processes, CVD processes, and PVD processes; conventional photolithographic processes; and conventional material removal processes, such as anisotropic etching processes) and conventional processing equipment, which are not described in detail herein.

Figure 9A:
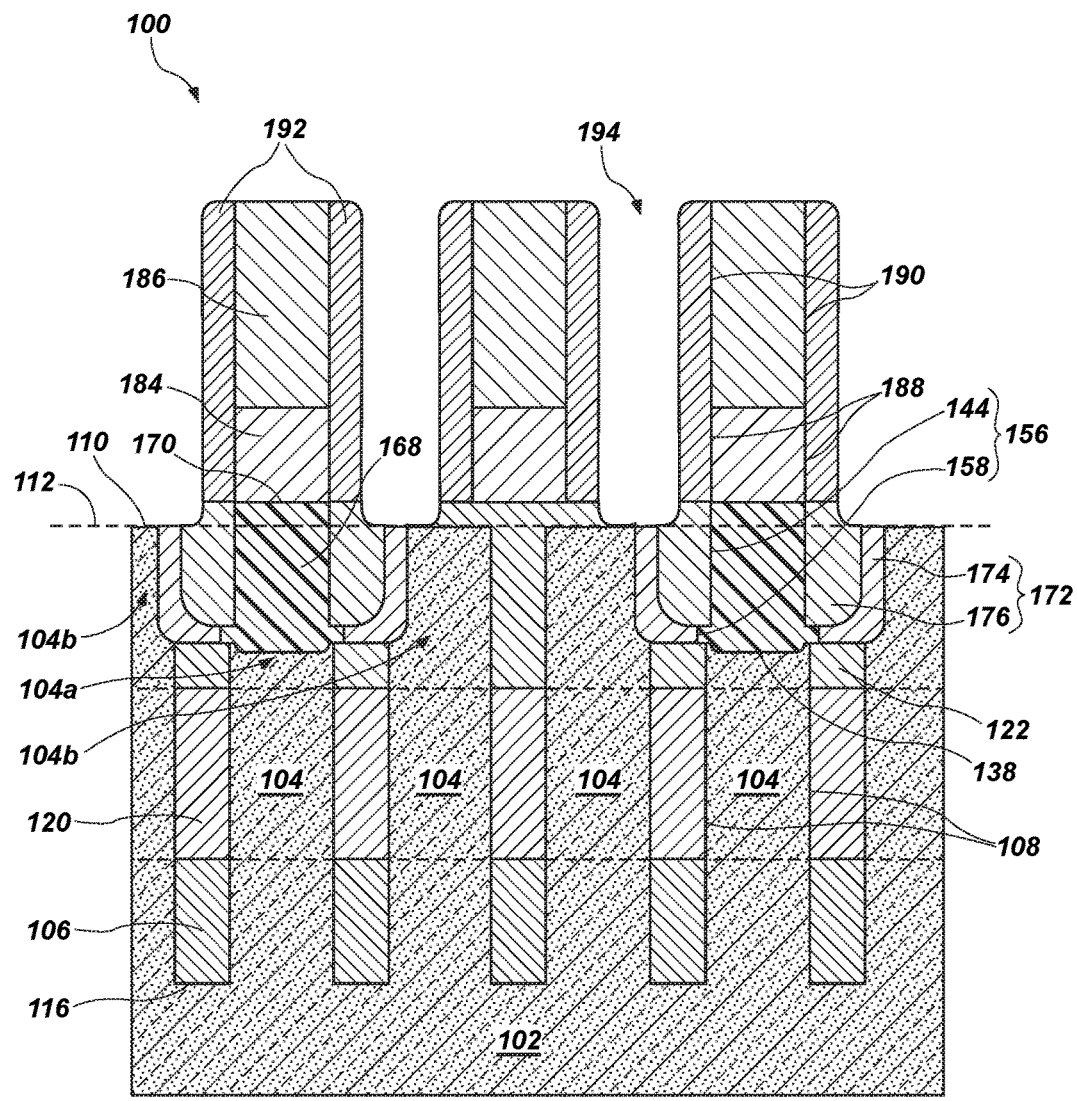
Figure 9B:
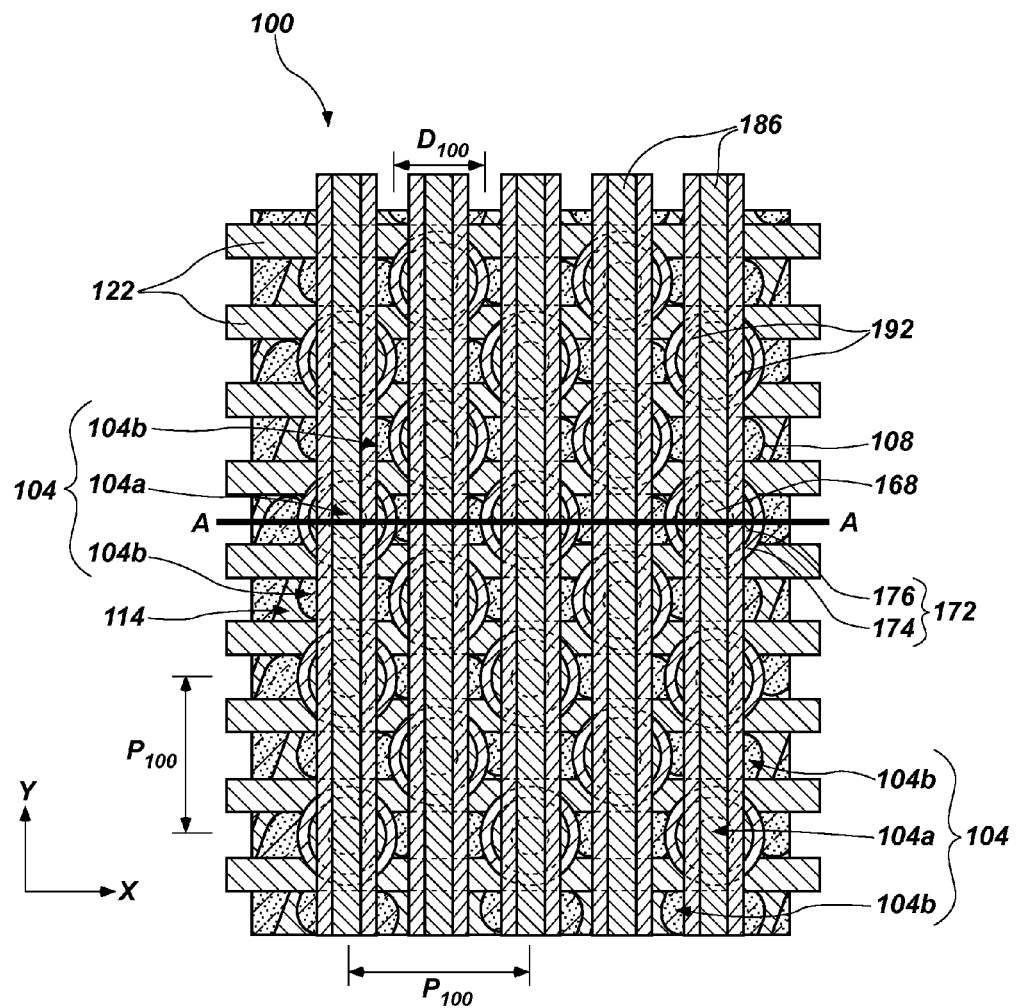

Referring to next to FIG. 9A, nitride spacers 192 may be formed on the opposing sidewalls 188 of the digit lines 184 and the opposing sidewalls 190 of the additional nitride caps 186. Pairs of the nitride spacers 192 on neighboring digit lines 184 and neighboring additional nitride caps 186 may be separated from one another by apertures 194. The apertures 194 may longitudinally extend to and expose portions of the upper surfaces 110 of the semiconductive pillars 104 (e.g., portions of the upper surfaces 110 of the storage node contact regions 104b of the semiconductive pillars 104). The apertures 194 may also longitudinally extend to and expose portions of the planarized composite structures 172 (e.g., portions of the planarized oxide structures 174, portions of the planarized nitride structures 176). FIG. 9B is a top-down view of the semiconductor device structure 100 at the processing stage shown in FIG. 9A. For clarity, the isolation material 106 is absent from (i.e., not depicted in) FIG. 9B.

Each of the nitride spacers 192 may be formed of and include a dielectric nitride material (e.g., Si$_3$N$_4$) suitable for use as a mask for selectively removing (e.g., etching, such as anisotropically dry etching) at least part of remaining portions of the planarized oxide structures 174 of the planarized composite structures 172. The material composition of the nitride spacers 192 may be the same as or may be different than the material composition of the nitride caps 122 and/or the material composition of the additional nitride caps 186. In some embodiments, the nitride spacers 192 are formed of and include Si$_3$N$_4$.

Each of the nitride spacers 192 may have substantially the same dimensions (e.g., width, length, and height). In addition, each of the apertures 194 may have substantially the same dimensions (e.g., width, length, and height). Widths of the nitride spacers 192 and of the apertures 194 may be selected to expose portions of the planarized composite structures 172 (e.g., portions of the planarized oxide structures 174 and the planarized nitride structures 176) and portions of the semiconductive pillars 104 (e.g., portions of the upper surfaces 110 of the storage node contact regions 104b of the semiconductive pillars 104). As a non-limiting example, each of the nitride spacers 192 may have a width within a range of from about 5 nm to about 13 nm, such as from about 6 nm to about 12 nm, about 7 nm to about 11 nm, or about 10 nm. In some embodiments, each of the nitride spacers 192 has a width of about 10 nm.

To form the nitride spacers 192, a nitride material may be conformally formed (e.g., deposited using a PVD process, a CVD process, an ALD process, or a spin-coating process) over exposed surfaces of the additional nitride caps 186, the digit lines 184, the planarized composite structures 172, the nitride caps 122, and the isolation material 106. A thickness of the nitride material may correspond to the width of the nitride spacers 192 to be formed. At least one etching process (e.g., an anisotropic etching process, such as an RIE process) may then be performed to substantially remove the nitride material from upper surfaces of the additional nitride caps 186 and the planarized oxide structures 174, and from portions of the upper surfaces of the planarized nitride structures 176, the nitride caps 122, and the isolation material 106, while maintaining the nitride material on the opposing sidewalls 190 of the additional nitride caps 186 and the opposing sidewalls 188 of the digit lines 184 to form the nitride spacers 192. As shown in FIG. 9A, the etching process may also remove portions of the nitride caps 122, the isolation material 106, and the planarized composite structures 172 (e.g., portions of the planarized oxide structures 174 and portions of the planarized nitride structures 176) overlying the common plane 112 shared by the upper surfaces 110 of the semiconductive pillars 104.

In additional embodiments, composite spacers may be formed on the opposing sidewalls 188 of the digit lines 184 and the opposing sidewalls 190 of the additional nitride caps 186 in place of the nitride spacers 192. The composite spacers may, for example, be formed of and include oxide spacers on the opposing sidewalls 188 of the digit lines 184 and on the opposing sidewalls 190 of the additional nitride caps 186, and nitride spacers on surfaces of the oxide spacers. The oxide spacers may be formed of and include a dielectric oxide material (e.g., a silicon oxide material, such as SiO$_2$, phosphosilicate glass, borosilicate glass, borophosphosilicate glass, or combinations thereof), and the nitride spacers may be formed of and include dielectric nitride material (e.g., a silicon nitride material, such as $Si_3N_4$). In some embodiments, the oxide spacers comprise $SiO_2$, and the nitride spacers comprise $Si_3N_4$. Widths of the composite spacers may correspond to the widths of the nitride spacers 192 previously described herein. To form the composite spacers, an oxide material may be conformally formed (e.g., deposited using a PVD process, a CVD process, an ALD process, or a spin-coating process) over exposed surfaces of the additional nitride caps 186, the digit lines 184, the planarized composite structures 172, the nitride caps 122, and the isolation material 106; a nitride material may be conformally formed over surfaces of the oxide material; and at least one etching process (e.g., an anisotropic etching process, such as an RIE process) may be performed to substantially remove the oxide material and the nitride material from upper surfaces of the additional nitride caps 186 and the planarized oxide structures 174, and from portions of the upper surfaces of the planarized nitride structures 176, the nitride caps 122, and the isolation material 106, while maintaining the oxide material and the nitride material on or over the opposing sidewalls 190 of the additional nitride caps 186 and the opposing sidewalls 188 of the digit lines 184.

Figure 10A:
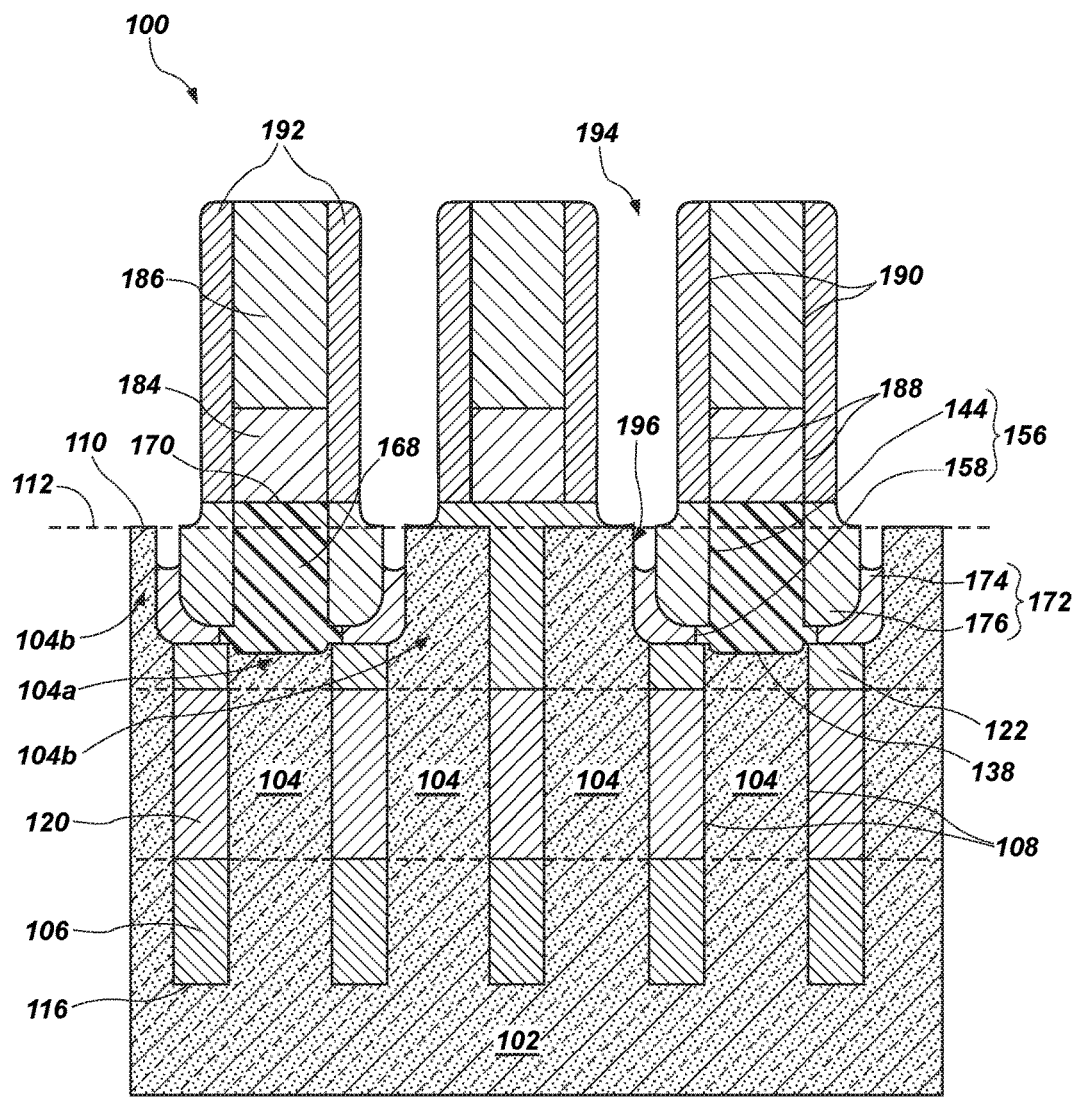
Figure 10B:
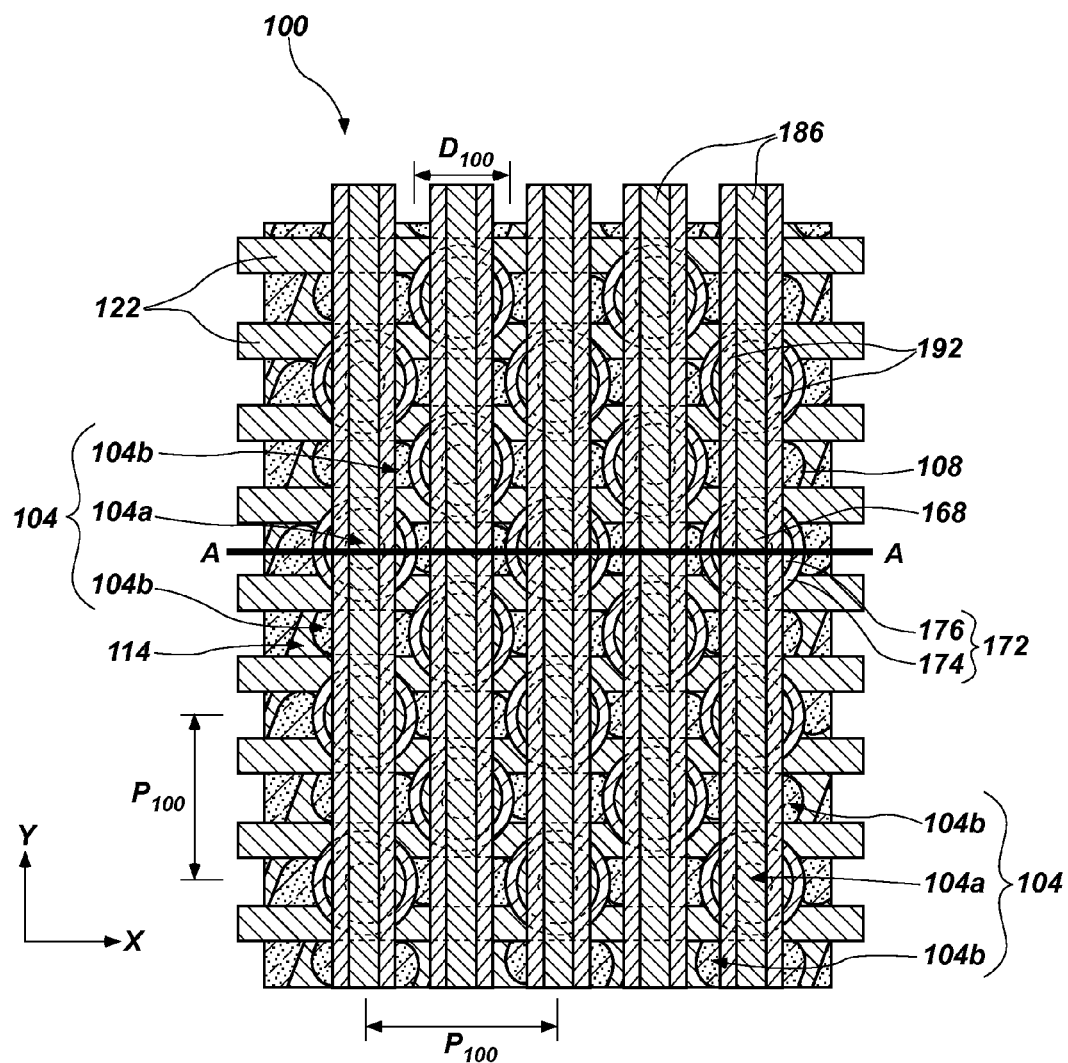

Referring next to FIG. 10A, upper portions of the planarized oxide structures 174 of the planarized composite structures 172 may be selectively removed to expose upper portions of the opposing sidewalls 108 of the semiconductive pillars 104 and form 3D storage node contacts 196 (e.g., 3D cell contacts). As shown in FIG. 10A, the 3D storage node contacts 196 may include exposed portions of the upper surfaces 110 and the opposing sidewalls 108 of the storage node contact regions 104b of the semiconductive pillars 104. FIG. 10B is a top-down view of the semiconductor device structure 100 at the processing stage shown in FIG. 10A. For clarity, the isolation material 106 is absent from (i.e., not depicted in) FIG. 10B.

The material removal process may include treating the semiconductive device structure 100 with at least one etchant (e.g., at least one wet etchant) formulated to selectively remove exposed portions of the planarized oxide structures 174 of the planarized composite structures 172, without substantially removing exposed portions of the nitride spacers 192, the additional nitride caps 186, the semiconductive pillars 104, the planarized nitride structures 176 of the planarized composite structures 172, and the nitride caps 122. By way of non-limiting example, the etchant may comprise at least one of HF, a BOE, and $HNO_3$. In some embodiments, the etchant comprises a solution including water and HF at a ratio within a range of from about 500:1 to about 100:1. The semiconductive device structure 100 may be exposed to the etchant using conventional processes (e.g., a sputter-coating process, a vapor-coating process, a spin-coating process, a spray-coating process, an immersion-coating process, a soaking process, combinations thereof) and conventional processing equipment, which are not described in detail herein.

The planarized composite structures 172 provide a simple and effective means of forming the 3D storage node contacts 196 that prevents undesired etching of the digit line contact plugs 168, the 3D storage node contacts 196, the additional nitride caps 186, and the nitride spacers 192, and effectively isolates the 3D storage node contacts 196 from the digit line contact plugs 168. For example, the planarized oxide structures 174 of the planarized composite structures 172 may be readily selectively removed relative to the semiconductive pillars 104, the planarized nitride structures 176, the addi-tional nitride caps 186, and the nitride spacers 192, facilitating the formation of the 3D storage node contacts 196 while substantially preserving the structure of the semiconductive pillars 104, the planarized nitride structures 176, the additional nitride caps 186, and the nitride spacers 192. In contrast, conventional methods of forming 3D storage node contacts, which do not include the formation and use of the planarized composite structures 172 (e.g., conventional methods which simply utilize nitride structures, such as nitride spacers or nitride collars, rather than the planarized composite structures 172), may require etching processes (e.g., RIE processes) to form cell contacts that can undesirably recess (e.g., etch) one or more features (e.g., semiconductive pillars, nitride caps, nitride spacers, nitride materials) of an associated semiconductor device structure, requiring relatively larger feature dimensions (e.g., nitride cap thicknesses, nitride spacer thickness) to account for such undesired recessing.

FIGS. 11A through 14B, are simplified cross-sectional (i.e., FIGS. 11A, 12A, 13A, and 14A) and top-down (i.e., FIGS. 11B, 12B, 13B, and 14B) views illustrating embodiments of another method of forming contacts for a semiconductor device structure, such as a DRAM device structure. Throughout the remaining description and the accompanying figures, functionally similar features are referred to with similar reference numerals incremented by 100. To avoid repetition, not all features shown in FIGS. 11A through 14B are described in detail herein. Rather, unless described otherwise below, a feature designated by a reference numeral that is a 100 increment of the reference numeral of a feature described previously will be understood to be substantially similar to the feature described previously, and will also be understood to be formed in a manner substantially similar to the manner described previously with respect to the feature described previously.

Figure 11A:
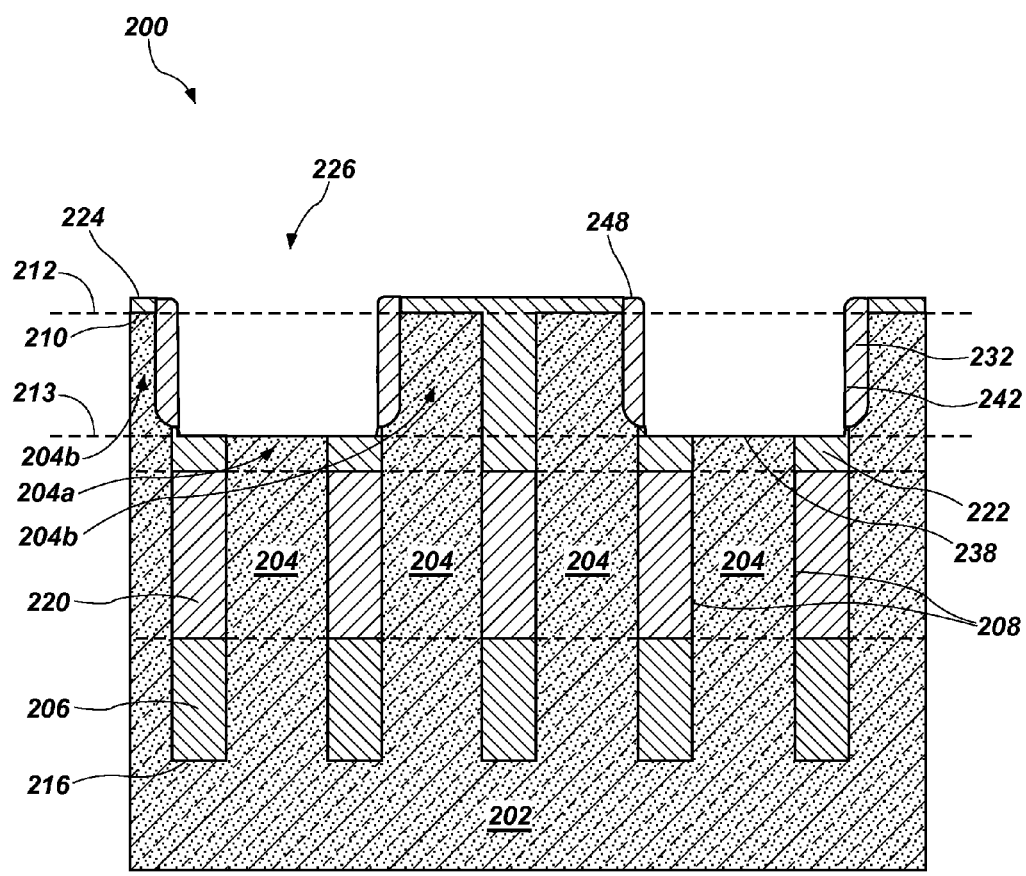
FIGS. 11A through 14B are cross-sectional (i.e., FIGS. 11A, 12A, 13A, and 14A) and top-down (i.e., FIGS. 11B, 12B, 13B, and 14B) views illustrating another method of forming contacts for a semiconductor device structure, in accordance with additional embodiments of the disclosure.
Figure 11B:
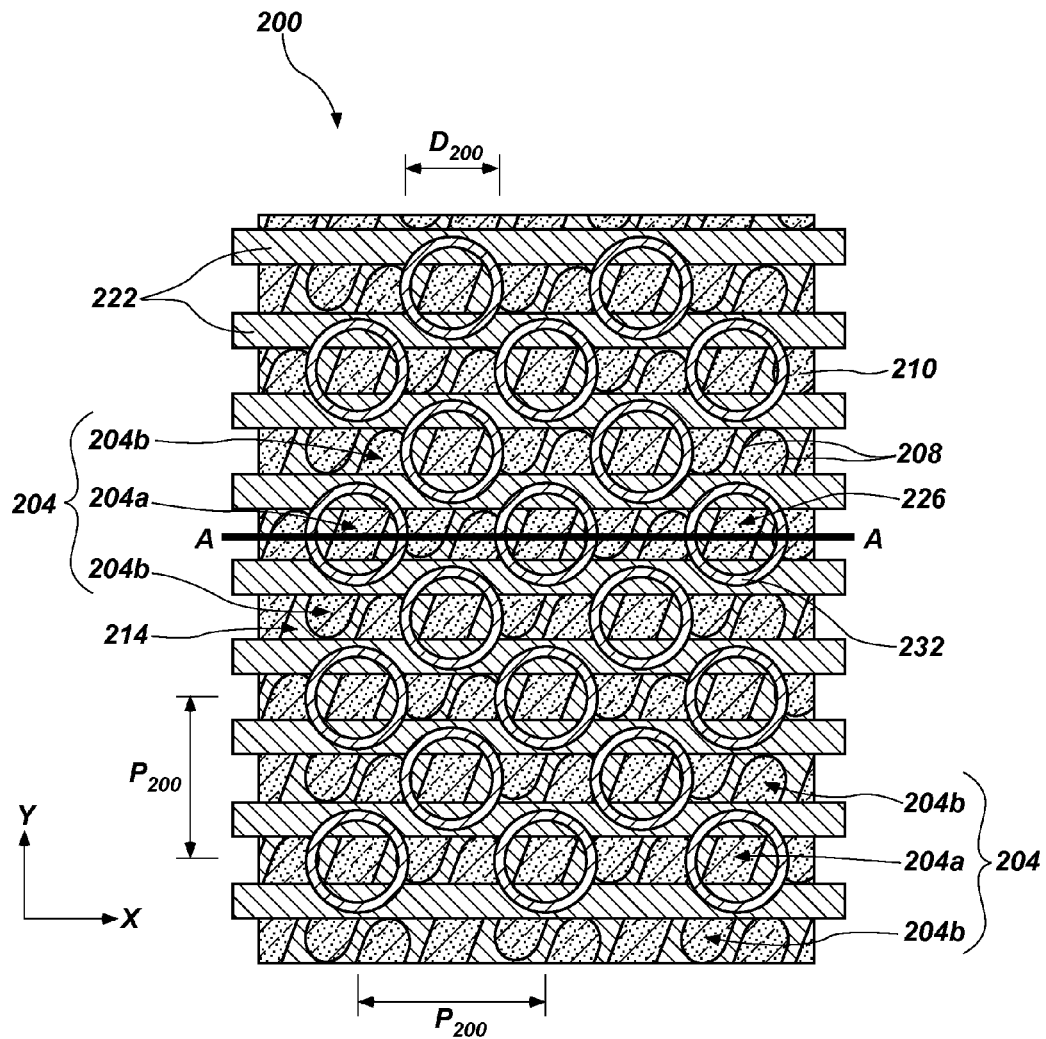

Referring to FIG. 11A, oxide structures 232 (e.g., spacers, collars) may be formed within contact holes 226 formed in and extending across portions of semiconductive pillars 204, an isolation material 206, and nitride caps 222. The contact holes 226, semiconductive pillars 204, isolation material 206, and nitride caps 222 may be substantially similar to the contact holes 126, the semiconductive pillars 104, the isolation material, and the nitride caps 122 previously described with respect to FIGS. 1A-3B. In addition, each of the oxide structures 232 may be formed of and include an oxide material substantially similar to the oxide material 128 previously described with respect to FIG. 4A. FIG. 11B is a top-down view of the semiconductor device structure 200 at the processing stage shown in FIG. 11A. For clarity, the isolation material 206 over and between the semiconductive pillars 204 is absent from (i.e., not depicted in) FIG. 11B.

Each of the oxide structures 232 may exhibit an annular shape within each of the contact holes 226, and may also exhibit a width facilitating subsequent formation of composite structures (e.g., spacers, collars) and contact plugs (e.g., digit line contact plugs) each having desired positioning and geometric configurations. For example, as described in further detail below, widths of the oxide structures 232 may be selected relative to widths of nitride structures to be formed thereon so as to subsequently form composite structures exhibiting dimensions permitting the formation and alignment of digit line contact plugs on or over digit line contact regions 204a of the semiconductive pillars 204. By way of non-limiting example, each of the oxide structures 232 may have a width within a range of from about 2 nm to about 8 nm, such as from about 3 nm to about 7 nm, about 4 nm to about 6 nm, or about 5 nm. In some embodiments, each of the oxide structures 232 has a width of about 5 nm. In addition, as shown in FIG. 11A, inner sidewalls 242 of the oxide structures 232 may be laterally offset from (e.g., laterally outward from) the opposing sidewalls 208 of the semiconductive pillars 204 thereunder. The inner sidewalls 242 of the oxide structures 232 may also longitudinally extend from upper surfaces 248 of the oxide structures 232 located above a common plane 212 shared by upper surfaces 210 of storage node contact regions 204b of the semiconductive pillars 204 to another common plane 213 shared by upper surfaces 238 of the digit line contact regions 204a of the semiconductive pillars 204.

To form the oxide structures 232, an oxide material (e.g., an oxide material substantially similar to the oxide material 128 previously described with respect to FIG. 4A) may be substantially conformally formed (e.g., deposited using a PVD process, a CVD process, an ALD process) over exposed surfaces of the semiconductive pillars 204, the isolation material 206, and the nitride caps 222 within and outside of the contact holes 226. A thickness of the oxide material may correspond to the width of the oxide structures 232 to be formed. At least one material removal (e.g., anisotropic etching) process may then be performed to substantially remove the oxide material from upper surfaces of the semiconductive pillars 204, and from portions of the upper surfaces of the nitride caps 222 and the isolation material 206, while maintaining the oxide material at least on sidewalls defining the contact holes 226 (e.g., sidewalls of the storage node contact regions 204b of the semiconductive pillars 204) to form the oxide structures 232.

Figure 12A:
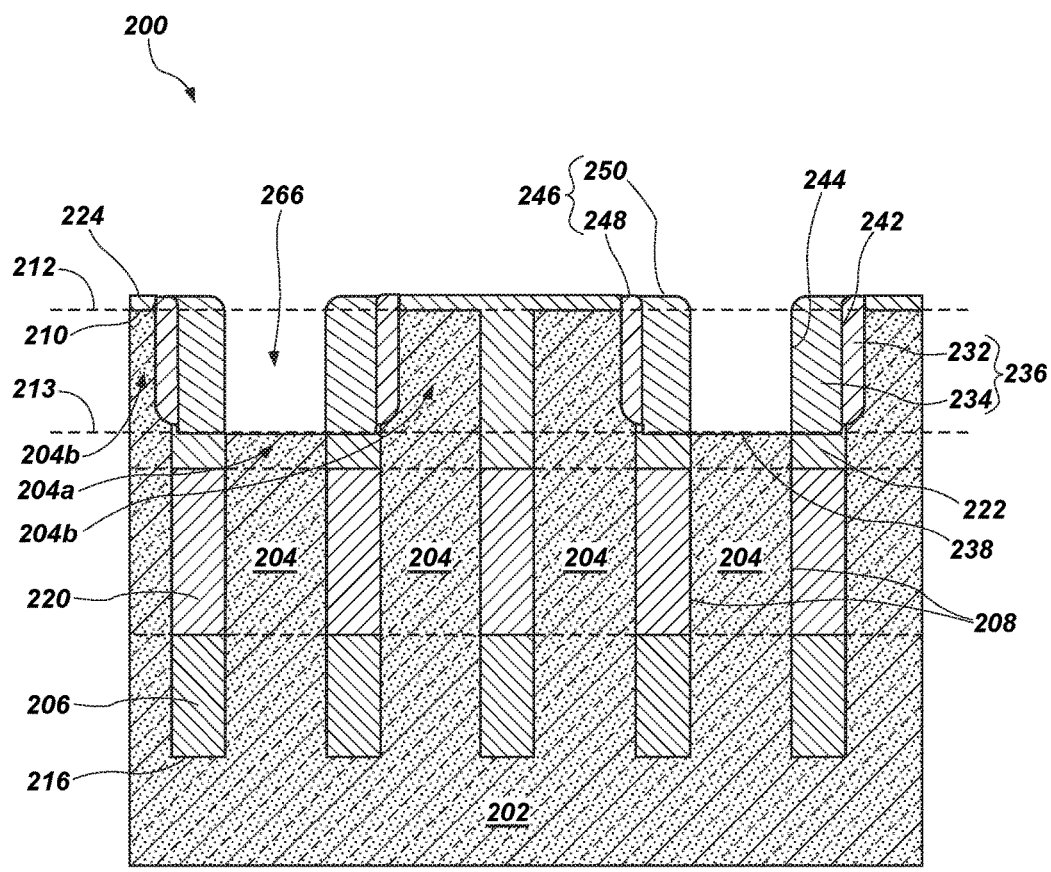
Figure 12B:
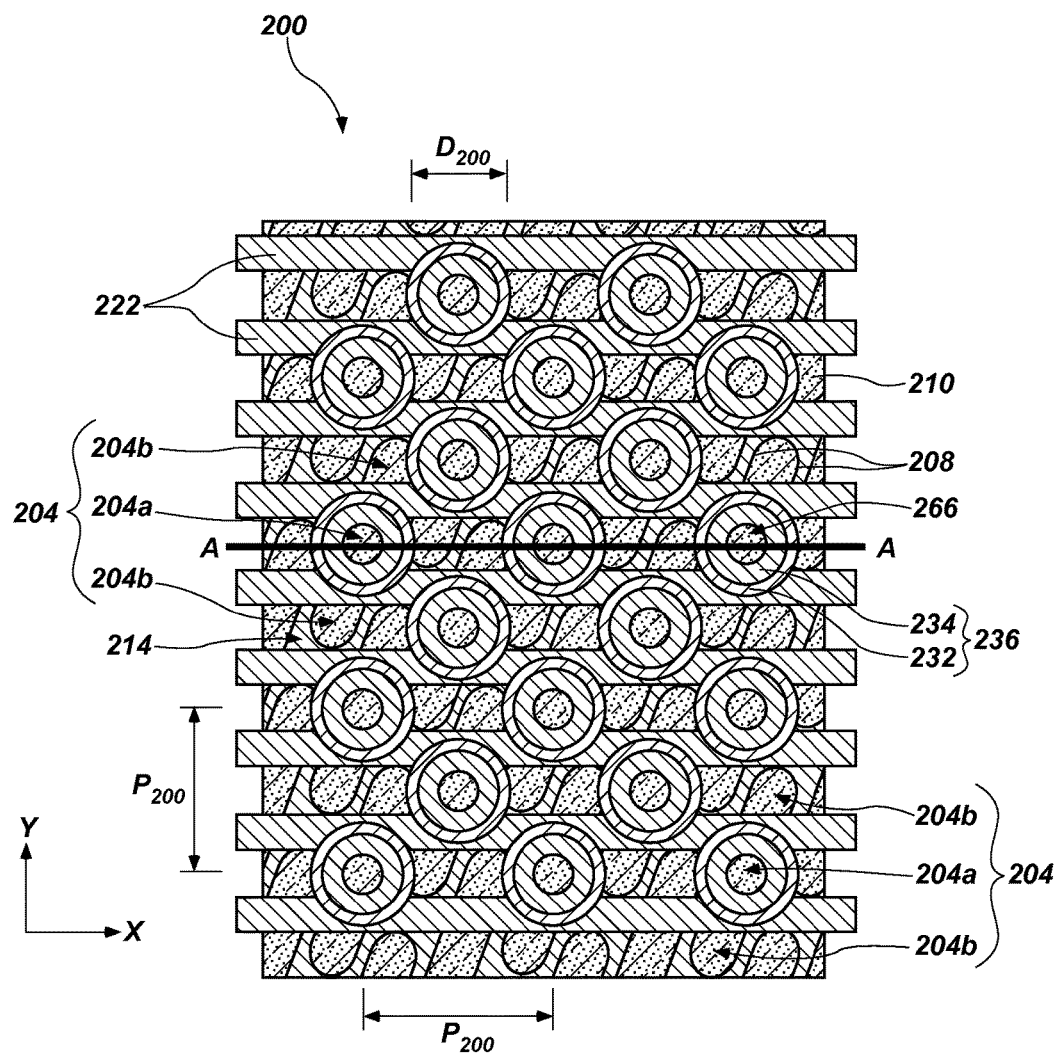

Referring next to FIG. 12A, nitride structures 234 (e.g., spacers, collars) may be formed on or over the inner sidewalls 242 of the oxide structures 232 to form composite structures 236 (e.g., composite spacers, composite collars) including the oxide structures 232 and the nitride structures 234. Each of the nitride structures 234 may be formed of and include a nitride material substantially similar to the nitride material 130 previously described with respect to FIG. 4A. FIG. 12B is a top-down view of the semiconductor device structure 200 at the processing stage shown in FIG. 12A. For clarity, the isolation material 206 over and between the semiconductive pillars 204 is absent from (i.e., not depicted in) FIG. 12B.

Each of the nitride structures 234 (and, hence, each of the composite structures 236) may exhibit an annular shape within each of the contact holes 226. In addition, the nitride structures 234 may exhibit a width facilitating a desired width of the composite structure 236. The widths of the nitride structures 234 (and, hence, the widths of the composite structures 236) may facilitate subsequent formation of contact plugs (e.g., digit line contact plugs) having desired positioning and geometric configurations. For example, as described in further detail below, the widths of the nitride structures 234 may be selected relative to widths of the oxide structures 232 upon which the nitride structures 234 are formed so that the composite structures 236 (e.g., spacers, collars) exhibit widths permitting the formation and alignment of digit line contact plugs on or over the digit line contact regions 204a of the semiconductive pillars 204. By way of non-limiting example, each of the nitride structures 234 may have a width within a range of from about 17 nm to about 23 nm, such as from about 18 nm to about 22 nm, about 19 nm to about 21 nm, or about 20 nm. In some embodiments, each of the nitride structures 234 has a width of about 20 nm.

As shown in FIG. 12A, the nitride structures 234 may substantially cover the inner sidewalls 242 of the oxide structures 232, such that inner sidewalls 244 of the nitride structures 234 constitute an entirety of the inner sidewalls of the composite structures 236. The inner sidewalls 244 of the nitride structures 234 may longitudinally extend from upper surfaces 250 of the nitride structures 234 located above the common plane 212 shared by the upper surfaces 210 of the storage node contact regions 204b of the semiconductive pillars 204 to the common plane 213 shared by the upper surfaces 238 of the digit line contact regions 204a of the semiconductive pillars 204. The inner sidewalls 244 of the nitride structures 234 may at least partially define digit line contact openings 266 for the subsequent formation of digit line contact plugs, as described in further detail below. The inner sidewalls 244 of the nitride structures 234 may align the digit line contact openings 266 with the digit line contact regions 204a of the semiconductive pillars 204. In some embodiments, the inner sidewalls 244 of the nitride structures 234 are substantially coplanar with the opposing sidewalls 208 of the semiconductive pillars 204. In additional embodiments, the inner sidewalls 244 of the nitride structures 234 are at least partially laterally offset from (e.g., laterally inward from laterally outward from) the opposing sidewalls 208 of the semiconductive pillars 204. Furthermore, as depicted in FIG. 12A, the upper surfaces 250 of the nitride structures 234 may be substantially coplanar with the upper surfaces 248 of the oxide structures 232. The upper surfaces 250 of the nitride structures 234 and the upper surfaces 248 of the oxide structures 232 may form upper surfaces 246 of the composite structures 236. In additional embodiments, the nitride structures 234 may substantially cover the upper surfaces 248 of the oxide structures 232, such that the upper surfaces 250 of the nitride structures 234 constitute an entirety of the upper surfaces 246 of the composite structures 236.

To form the nitride structures 234, a nitride material (e.g., a nitride material substantially similar to the nitride material 130 previously described with respect to FIG. 4A) may be conformally formed (e.g., deposited using a PVD process, a CVD process, an ALD process, or a spin-coating process) over exposed surfaces of the oxide structures 232, the semiconductive pillars 204, the isolation material 206, and the nitride caps 222 within and outside of the contact holes 226 (FIG. 11A). A thickness of the nitride material may correspond to the width of the nitride structures 234 to be formed. At least one material removal (e.g., anisotropic etching) process may then be performed to substantially remove the nitride material from upper surfaces of the semiconductive pillars 204, and from portions of the upper surfaces of the nitride caps 222, the isolation material 206, and the oxide structures 232, while maintaining the nitride material at least on the inner sidewalls 242 of the oxide structures 232 to form the nitride structures 234 (and, hence, the composite structures 236).

Figure 13A:
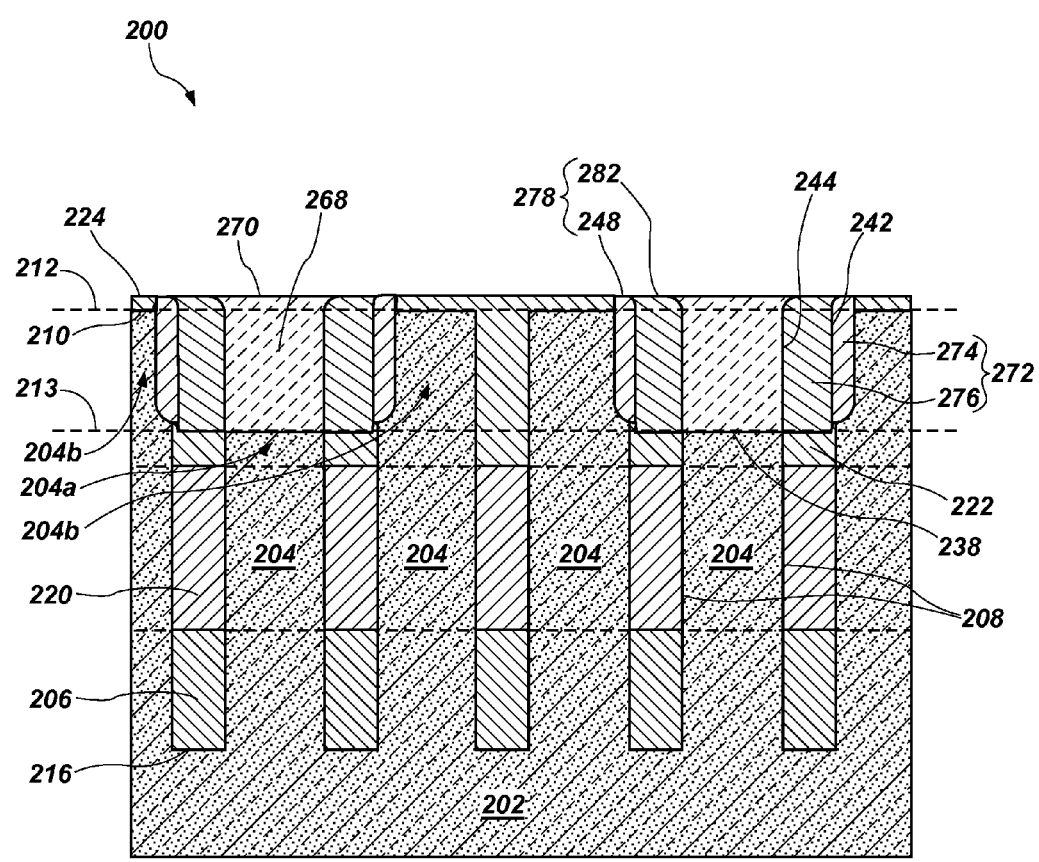
Figure 13B:
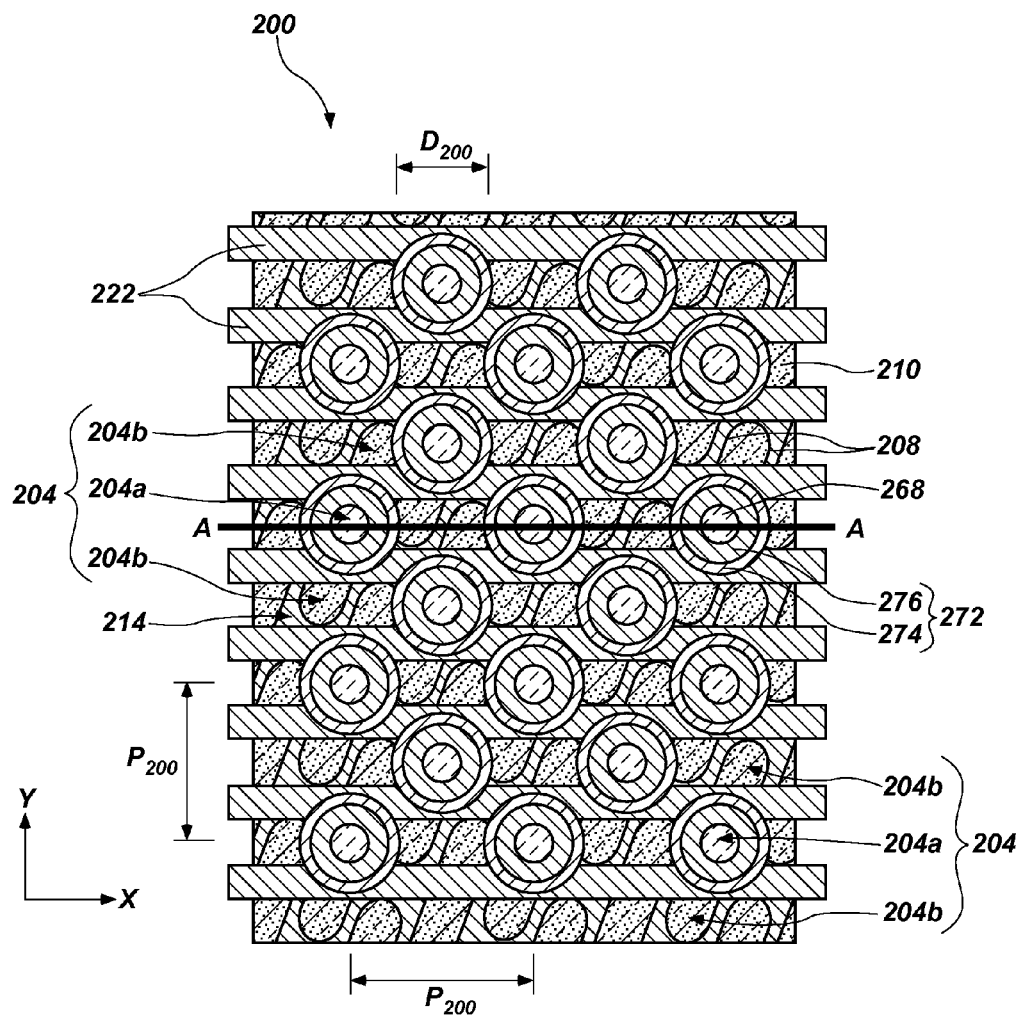

Referring next to FIG. 13A, surfaces of the composite structures 236 (FIG. 12A) (e.g., the inner sidewalls 244 of the nitride structures 234, and the upper surfaces 246 of the composite structures 236), the semiconductive pillars 204 (e.g., the upper surfaces 238 of the digit line contact regions 204a of the semiconductive pillars 204), the isolation material 206, and the nitride caps 222 may be subjected to at least one cleaning process, and then digit line contact plugs 268 may be formed within and substantially fill the digit line contact openings 266 (FIG. 12A). FIG. 13B is a top-down view of the semiconductor device structure 100 at the processing stage shown in FIG. 13A. For clarity, the isolation material 206 is absent from (i.e., not depicted in) FIG. 13B.

The cleaning process may remove oxide material (e.g., SiO$_2$) on the upper surfaces 238 of the digit line contact regions 204a of the semiconductive pillars 204. The cleaning process may also recess exposed portions of the oxide structures 232 (FIG. 12A) of the composite structures 236, such as the upper surfaces 248 (FIG. 12A) of the oxide structures 232. Unlike the cleaning process previously described with respect to FIG. 6A, since the nitride structures 234 (FIG. 12A) substantially cover the inner sidewalls 242 of the oxide structures 232, the inner sidewalls 242 of the oxide structures 232 may remain substantially unmodified (e.g., may remain substantially intact, may not become recessed) by the cleaning process. In addition, in embodiments wherein the nitride structures 234 (FIG. 12A) substantially cover the upper surfaces 248 of the oxide structures 232, the upper surfaces 248 (FIG. 12A) of the oxide structures 232 may also remain substantially unmodified (e.g., may remain substantially intact, may not become recessed) by the cleaning process. Thus, the nitride structures 234 may protect portions of the oxide structures 232 thereunder from being removed by the cleaning process. The cleaning process may be substantially similar to the cleaning process previously described with respect to FIG. 6A.

As shown in FIG. 13A, the digit line contact plugs 268 may substantially fill the digit line contact openings 266 (FIG. 12A). The digit line contact plugs 268 may be formed of and include a conductive material, such as doped polysilicon. As depicted in FIG. 13A, the process of forming the digit line contact plugs 268 may remove upper portions of the composite structures 236 (FIG. 12A) (e.g., upper portions of the nitride structures 234, upper portions of the oxide structures 232) to form planarized composite structures 272 including planarized oxide structures 274 and planarized nitride structures 276. Upper surfaces 270 of the digit line contact plugs 268 may be substantially coplanar with upper surfaces 278 of the planarized composite structures 272, including upper surfaces 280 of the planarized oxide structures 274 and upper surfaces 282 of the planarized nitride structures 276. The process of forming the digit line contact plugs 268 may also recess the upper surfaces 224 of the nitride caps 222 such that the upper surfaces 224 of the nitride caps 222 are substantially coplanar with the upper surfaces 270 of the digit line contact plugs 268 and the upper surfaces 278 of the planarized composite structures 272. In additional embodiments, upper portions of at least one of the composite structures 236 (FIG. 12A) and the nitride caps 222 may remain substantially unmodified (e.g., may remain substantially intact, may not become recessed) by the process of forming the digit line contact plugs 268, but the upper surfaces 270 of the digit line contact plugs 268 may nonetheless be substantially coplanar with the upper surfaces 246 (FIG. 12A) of the composite structures 236 and the upper surfaces 224 of the nitride caps 222. The process of forming the digit line contact plugs 268 may be substantially similar to the process of forming the digit line contact plugs 168 previously described with respect to FIG. 7A.

Figure 14A:
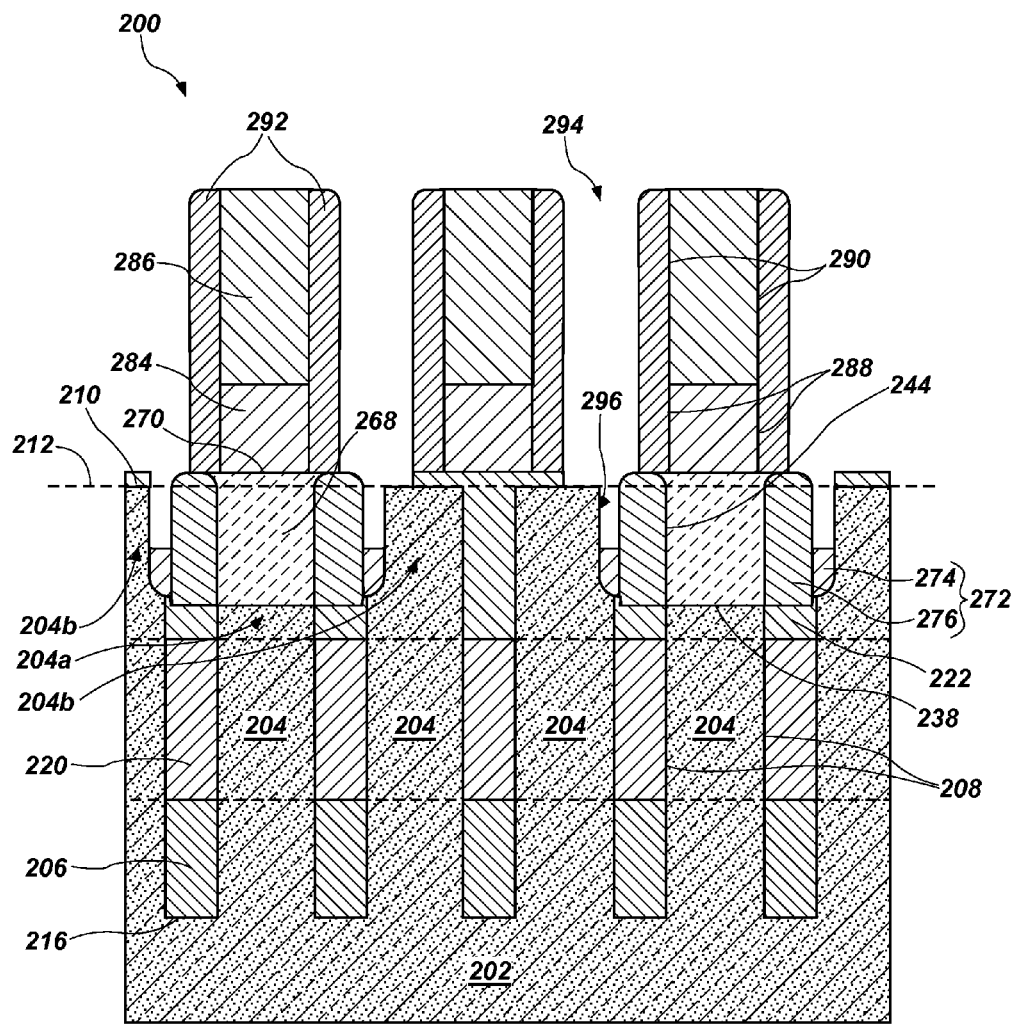
Figure 14B:
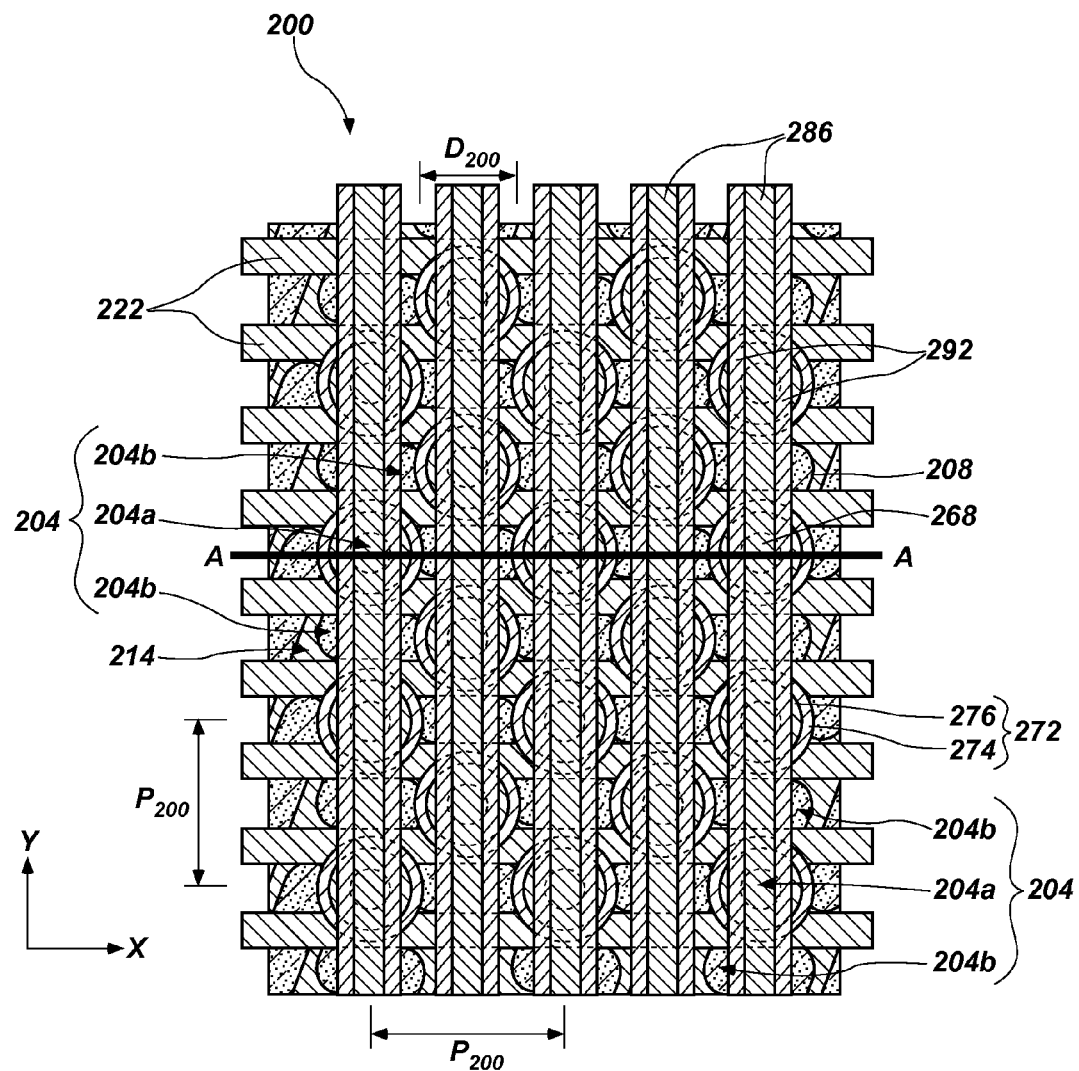

Referring next to FIG. 14A, the semiconductor device structure 200 may be subjected to additional processing to form digit lines 284 on or over the digit line contact plugs 268 in a direction substantially perpendicular (e.g., orthogonal) to the direction in which the wordlines 220 and the nitride caps 222 extend, and additional nitride caps 286 may be formed on or over the digit lines 284. Pairs of nitride spacers 292 (or pairs of composite spacers, such as composite spacers substantially similar to those previously described in relation to the semiconductor device structure 100 depicted in FIGS. 9A and 9B) separated from one another by apertures 294 vertically extending to upper surfaces 210 of a portion of the semiconductive pillars 204 (e.g., the upper surfaces 210 of the storage node contact regions 204b of the semiconductive pillars 204) may then be formed on or over opposing sidewalls 290 of the additional nitride caps 286 and opposing sidewalls 288 of the digit lines 284. Upper portions of the planarized oxide structures 274 of the planarized composite structures 272 may then be selectively removed to form 3D storage node contacts 296. The digit lines 284, the additional nitride caps 286, the nitride spacers 292, the apertures 294, and the 3D storage node contacts 296 may respectively be substantially similar to the digit lines 184, the additional nitride caps 186, the nitride spacers 192, the apertures 194, and the 3D storage node contacts 196 previously described with reference to FIGS. 8A through 10B. Furthermore, the additional processing of the semiconductor device structure 200 may be substantially similar to the processing of the semiconductor device structure 100 previously described above with reference to FIGS. 8A through 10B. FIG. 14B is a top-down view of the semiconductor device structure 200 at the processing stage shown in FIG. 14A. For clarity, the isolation material 206 is absent from (i.e., not depicted in) FIG. 14B.

Thus, in accordance with embodiments of the disclosure, a method of forming contacts for a semiconductor device structure comprises forming contact holes extending into neighboring semiconductive pillars and into a nitride material of nitride-capped electrodes. Composite structures are formed within the contact holes, the composite structures partially filling the contact holes and comprising oxide structures over sidewalls of the contact holes and nitride structures over the oxide structures. Conductive structures are formed over inner sidewalls of the composite structures, the conductive structures filling remaining portions of the contact holes and confined within boundaries of the contact holes. Additional nitride-capped electrodes are formed over the conductive structures, the additional nitride-capped electrodes extending perpendicular to the nitride-capped electrodes. Pairs of nitride spacers are formed over opposing sidewalls of the additional nitride-capped electrodes, neighboring pairs of nitride spacers separated by apertures extending to upper surfaces of a portion of the neighboring semiconductive pillars. Portions of the oxide structures are removed to expose sidewalls of the portion of the neighboring semiconductive pillars.

In addition, in accordance with embodiments of the disclosure, a method of forming a semiconductor device structure comprises forming semiconductive pillars longitudinally extending from a semiconductive base and separated from one another by an isolation material, each of the semiconductive pillars having a digit line contact region disposed between storage node contact regions. Wordlines and nitride caps over the wordlines are each formed to extend through the semiconductive pillars and the isolation material in a direction offset from another direction in which the semiconductive pillars extend. Contact holes are formed in portions of the semiconductive pillars, the isolation material, and the nitride caps, the contact holes laterally extending across the digit line contact region of each of the semiconductive pillars and into the storage node contact regions of other semiconductive pillars neighboring the semiconductive pillars. Composite structures are formed within the contact holes and comprise oxide structures on sidewalls of the contact holes and nitride structures on sidewalls of the oxide structures, inner sidewalls of the composite structures aligning an unfilled portion of each of the contact holes with the digit line contact region of each of the semiconductive pillars. Digit line contact plugs are formed within the unfilled portions of the contact holes. Digit lines covered with additional nitride caps and nitride spacers are formed over the digit line contact plugs and extend in an additional direction perpendicular to the direction in which the wordlines and the nitride caps extend. Portions of the composite structures are removed to expose surfaces of the storage node contact regions of the other semiconductive pillars.

Furthermore, a semiconductor device structure of the disclosure comprises semiconductive pillars longitudinally extending from a semiconductive base and separated from one another by an isolation material, each of the semiconductive pillars having a digit line contact region disposed between storage node contact regions. Nitride-capped wordlines each extend through the semiconductive pillars and the isolation material in a direction offset from another direction in which the semiconductive pillars extend. Filled contact holes laterally extend across the digit line contact region of each of the semiconductive pillars and into the storage node contact regions of neighboring semiconductive pillars. The filled contact holes comprise annular composite structures and digit line contact plugs adjacent to inner sidewalls of the annular composite structures and aligned with the digit line contact regions of the semiconductive pillars. The annular composite structures comprise oxide structures adjacent to and partially covering sidewalls of the storage node contact regions of the neighboring semiconductive pillars, and nitride structures adjacent to inner sidewalls of the oxide structures and exhibiting upper surfaces longitudinally above upper surfaces of the oxide structures. Nitride-capped digit lines are located over the digit line contact plugs and extend in a direction perpendicular to the nitride-capped wordlines. Nitride spacers are located on the upper surfaces of the nitride structures of the annular composite structures and on opposing sidewalls of the nitride-capped digit lines.

The methods of the disclosure provide an effective and reliable way to control the dimensions and spacing of digit line contacts (e.g., the digit line contact plugs 168, 268) and 3D storage node contacts (e.g., the 3D storage node contacts 196, 296) of a semiconductor device structure (e.g., the semiconductor device structures 100, 200), such as a DRAM device structure. The methods facilitate simple and cost-effective formation and alignment of the digit line contacts and the 3D storage node contacts with reduced risk of shorts and junction leakage as compared to conventional methods of forming and aligning digit line contacts and 3D storage node contacts for a semiconductor device structure. The methods of the disclosure may facilitate improved device performance, lower cost, increased miniaturization of components, improve pattern quality, and greater packaging density as compared to conventional methods of forming and aligning contacts (e.g., digit line contacts, 3D storage node contacts) for a semiconductor device structure.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming contacts for a semiconductor device structure, comprising:

forming contact holes extending into neighboring semiconductive pillars and into a nitride material of nitride-capped electrodes;

forming composite structures within the contact holes, the composite structures partially filling the contact holes and comprising oxide structures over sidewalls of the contact holes and nitride structures over the oxide structures;

forming conductive structures over inner sidewalls of the composite structures, the conductive structures filling remaining portions of the contact holes and confined within boundaries of the contact holes;

forming additional nitride-capped electrodes over the conductive structures, the additional nitride-capped electrodes extending perpendicular to the nitride-capped electrodes;

forming pairs of nitride spacers over opposing sidewalls of the additional nitride-capped electrodes, neighboring pairs of nitride spacers separated by apertures extending to upper surfaces of a portion of the neighboring semiconductive pillars; and removing portions of the oxide structures to expose sidewalls of the portion of the neighboring semiconductive pillars.

2. The method of claim 1, wherein forming contact holes extending into neighboring semiconductive pillars comprises forming the contact holes to extend into and completely across center semiconductive pillars of groups of three semiconductive pillars and into and partially across outer semiconductive pillars of the groups of three semiconductive pillars.

3. The method of claim 1, wherein forming composite structures within the contact holes comprises forming the oxide structures and the nitride structures substantially simultaneously.

4. The method of claim 1, wherein forming composite structures within the contact holes comprises forming the nitride structures after forming the oxide structures.

5. The method of claim 1, wherein forming conductive structures over inner sidewalls of the composite structures comprises:

forming doped polysilicon within the remaining portions of the contact holes; and removing portions of the doped polysilicon outside of the contact holes.

6. The method of claim 1, wherein forming conductive structures over inner sidewalls of the composite structures comprises forming lower portions of the conductive structures to extend laterally outward beyond inner sidewalls of the nitride structures.

7. The method of claim 1, wherein forming pairs of nitride spacers over opposing sidewalls of the additional nitride-capped electrodes comprises:

forming another nitride material at least over exposed surfaces of the nitride-capped electrodes, the additional nitride-capped electrodes, and the composite structures; and performing an anisotropic etch process to remove portions of the another nitride material overlying upper surfaces of the additional nitride-capped electrodes, the additional nitride-capped electrodes, and the composite structures, and form the apertures extending to the upper surfaces of the portion of the neighboring semiconductive pillars.

8. The method of claim 1, wherein removing portions of the oxide structures to expose sidewalls of the portion of the neighboring semiconductive pillars comprises performing at least one wet etching process to selectively remove the portions of the oxide structures relative to the nitride structures, the nitride-capped electrodes, the additional nitride-capped electrodes, the nitride spacers, and the neighboring semiconductive pillars.

9. A method of forming a semiconductor device structure, comprising:
   forming semiconductive pillars longitudinally extending from a semiconductive base and separated from one another by an isolation material, each of the semiconductive pillars having a digit line contact region disposed between storage node contact regions;
   forming wordlines and nitride caps over the wordlines, the wordlines and the nitride caps each extending through the semiconductive pillars and the isolation material and having a different orientation than the semiconductive pillars;
   forming contact holes in portions of the semiconductive pillars, the isolation material, and the nitride caps, the contact holes laterally extending across the digit line contact region of each of the semiconductive pillars and into the storage node contact regions of other semiconductive pillars neighboring the semiconductive pillars;
   forming composite structures within the contact holes and comprising oxide structures on sidewalls of the contact holes and nitride structures on sidewalls of the oxide structures, inner sidewalls of the composite structures aligning an unfilled portion of each of the contact holes with the digit line contact region of each of the semiconductive pillars;
   forming digit line contact plugs within the unfilled portions of the contact holes;
   forming digit lines covered with additional nitride caps and nitride spacers over the digit line contact plugs and extending in an additional direction perpendicular to the direction in which the wordlines and the nitride caps extend; and
   removing portions of the composite structures to expose surfaces of the storage node contact regions of the other semiconductive pillars.

10. The method of claim 9, wherein forming contact holes in portions of the semiconductive pillars, the isolation material, and the nitride caps comprises forming the contact holes to extend into and completely across the digit line contact region of each of the semiconductive pillars, into and partially across the storage node contact regions of the other semiconductive pillars neighboring the semiconductive pillars, and into and partially across neighboring nitride caps adjacent opposing sides of the digit line contact region of each of the semiconductive pillars.

11. The method of claim 9, wherein forming composite structures within the contact holes comprises:
   forming an oxide material over exposed surfaces within and outside of the contact holes;
   forming another nitride material over exposed surfaces of the oxide material; and
   removing portions of the oxide material and the another nitride material outside of the contact holes, and portions of the oxide material and the another nitride material that overly the digit line contact region of each of the semiconductive pillars within the contact holes.

12. The method of claim 9, wherein forming composite structures within the contact holes comprises forming the inner sidewalls of the composite structures to comprise inner sidewalls of the oxide structures and inner sidewalls of the nitride structures, the inner sidewalls of the oxide structures substantially coplanar with the inner sidewalls of the nitride structures.

13. The method of claim 12, wherein forming digit line contact plugs within the unfilled portions of the contact holes comprises:
   performing at least one material removal process to clean an upper surface of the digit line contact region of each of the semiconductor pillars and recess the inner sidewalls of the oxide structures relative to the inner sidewalls of the nitride structures to form digit line contact openings;
   forming a conductive material to fill the digit line contact openings; and
   removing portions of the conductive material extending beyond boundaries of the digit line contact openings.

14. The method of claim 9, wherein forming composite structures within the contact holes comprises:
   forming annular oxide structures confined within the contact holes and covering sidewalls of the contact holes; and
   forming annular nitride structures confined within the contact holes and covering inner sidewalls of the annular oxide structures, inner surfaces of the annular nitride structures defining the inner sidewalls of the composite structures.

15. The method of claim 14, wherein forming digit line contact plugs within the unfilled portions of the contact holes comprises:
   performing at least one material removal process to clean an upper surface of the digit line contact region of each of the semiconductor pillars without recessing the inner sidewalls of the composite structures;
   forming a conductive material to fill the unfilled portions of the contact holes; and
   removing portions of the conductive material extending beyond upper boundaries of the contact holes.

16. The method of claim 9, wherein forming digit lines covered with additional nitride caps and nitride spacers over the digit line contact plugs comprises:
   forming the digit lines on and between upper surfaces of the digit line contact plugs extending in the additional direction, the digit lines aligned with the digit line contact plugs thereunder;
   forming the additional nitride caps on upper surfaces of the digit lines, opposing sidewalls of the additional nitride caps coplanar with opposing sidewalls of the digit lines; and
   forming the nitride spacers on the opposing sidewalls of the digit lines and the additional nitride caps, neighboring pairs of the nitride spacers separated by apertures longitudinally extending to and exposing upper surfaces of the storage node contact regions of the other semiconductive pillars.

17. The method of claim 9, wherein removing portions of the composite structures to expose surfaces of the storage node contact regions of the other semiconductive pillars comprises selectively removing upper portions of the oxide structures to expose upper portions of sidewalls of the storage node contact regions of the other semiconductive pillars.

18. The method of claim 17, wherein selectively removing upper portions of the oxide structures to expose upper portions of sidewalls of the storage node contact regions of the other semiconductive pillars comprises treating exposed portions of the composite structures, the nitride-capped electrodes, the additional nitride-capped electrodes, the nitride spacers, and the other semiconductive pillars with at least one wet etchant formulated to remove a portion of the oxide structures relative to the nitride structures, the nitride-capped electrodes, the additional nitride-capped electrodes, the nitride spacers, and the other semiconductive pillars.

* * * * *

UNITED STATES PATENT AND TRADEMARK OFFICE
CERTIFICATE OF CORRECTION

PATENT NO. : 9,564,442 B2  
APPLICATION NO. : 14/681884  
DATED : February 7, 2017  
INVENTOR(S) : Sanh D. Tang et al.

Page 1 of 1

It is certified that error appears in the above-identified patent and that said Letters Patent is hereby corrected as shown below:

In the Specification

Column 18, Line 22, change "laterally inward from laterally outward" to
--laterally inward from, laterally outward--

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*